(12) United States Patent
Oshima et al.

(10) Patent No.: US 10,770,549 B2
(45) Date of Patent: Sep. 8, 2020

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Toshiyuki Oshima, Bunkyo (JP); Shinya Kyogoku, Nagareyama (JP); Ryosuke Iijima, Setagaya (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 23 days.

(21) Appl. No.: 16/286,644

(22) Filed: Feb. 27, 2019

(65) Prior Publication Data

US 2020/0035791 A1 Jan. 30, 2020

(30) Foreign Application Priority Data

Jul. 26, 2018 (JP) .................................. 2018-139889

(51) Int. Cl.
*H01L 29/16* (2006.01)
*H01L 29/40* (2006.01)
(Continued)

(52) U.S. Cl.
CPC ........ *H01L 29/1608* (2013.01); *H01L 29/407* (2013.01); *H01L 29/4236* (2013.01);
(Continued)

(58) Field of Classification Search
CPC .............. H01L 29/1608; H01L 29/407; H01L 29/4236; H01L 29/66734
(Continued)

(56) References Cited

U.S. PATENT DOCUMENTS

| 9,865,726 | B2* | 1/2018 | Laforet ............. H01L 21/02164 |
| 2008/0164520 | A1* | 7/2008 | Darwish ............. H01L 29/7835 257/334 |

(Continued)

FOREIGN PATENT DOCUMENTS

| JP | 2015-153854 | 8/2015 |
| JP | 2017-50516 | 3/2017 |
| WO | WO 2017/038518 A1 | 3/2017 |

*Primary Examiner* — Igwe U Anya
(74) *Attorney, Agent, or Firm* — Oblon, McClelland, Maier & Neustadt, L.L.P.

(57) ABSTRACT

A semiconductor device according to an embodiment includes a silicon carbide layer having a first and second plane, first and second trench extending in first direction, and in the silicon carbide layer, n-type first region, p-type second region between the n-type first region and the first plane and between the first and second trench, p-type fifth region covering bottom of the first trench, p-type sixth region covering bottom of the second trench, n-type seventh region between the fifth region and the second region, n-type eighth region between the sixth and second regions, p-type ninth regions contacting the fifth and second regions, and p-type tenth regions contacting the sixth region and the second region, the ninth and tenth regions repeatedly disposed in the first direction, and a line segment connecting the ninth region and the tenth region is oblique with respect to second direction perpendicular to the first direction.

20 Claims, 33 Drawing Sheets

(51) Int. Cl.
*H01L 29/66* (2006.01)
*H01L 29/423* (2006.01)
*H01L 29/78* (2006.01)
*H02M 7/48* (2007.01)
*B66B 1/28* (2006.01)

(52) U.S. Cl.
CPC .. *H01L 29/66053* (2013.01); *H01L 29/66734* (2013.01); *H01L 29/7813* (2013.01); *H02M 7/48* (2013.01); *B60L 2210/40* (2013.01); *B66B 1/28* (2013.01)

(58) Field of Classification Search
USPC .......................................................... 257/77
See application file for complete search history.

(56) References Cited

U.S. PATENT DOCUMENTS

| | | | |
|---|---|---|---|
| 2011/0254010 A1* | 10/2011 | Zhang | H01L 29/66068 257/66 |
| 2013/0214290 A1* | 8/2013 | Hayashi | H01L 29/66666 257/77 |
| 2016/0099316 A1* | 4/2016 | Arai | H01L 29/66734 257/77 |
| 2018/0097069 A1* | 4/2018 | Utsumi | H01L 29/0623 |
| 2020/0020797 A1* | 1/2020 | Suzuki | H01L 29/66068 |

* cited by examiner

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2018-139889, filed on Jul. 26, 2018, the entire contents of which are incorporated herein by reference.

FIELD

Embodiments described herein relate generally to semiconductor device, inverter circuit, driving device, vehicle, and elevator.

BACKGROUND

Silicon carbide (SiC) is expected as a material for next generation semiconductor devices. Compared to silicon, silicon carbide has superior physical properties such as a band gap of about 3 times, a breakdown electric field strength of about 10 times, and a thermal conductivity of about 3 times. By utilizing this physical property, it is possible to realize a semiconductor device capable of operating with low loss and at high temperature.

When a short-circuit occurs in the load while a MOSFET (Metal Oxide Semiconductor Field Effect Transistor) using silicon carbide is turned on, a high voltage is applied between the drain and source of the MOSFET. When a high voltage is applied between the drain and source, breakdown of the MOSFET occurs. Breakdown of MOSFET is thought to be due to heat generation caused by large current flow.

In order to avoid breakdown of the MOSFET, it is required to lengthen the time from the short-circuit of the load to the breakdown of the MOSFET. In other words, it is required to improve short-circuit withstand capability.

DETAILED DESCRIPTION

Figure 1:
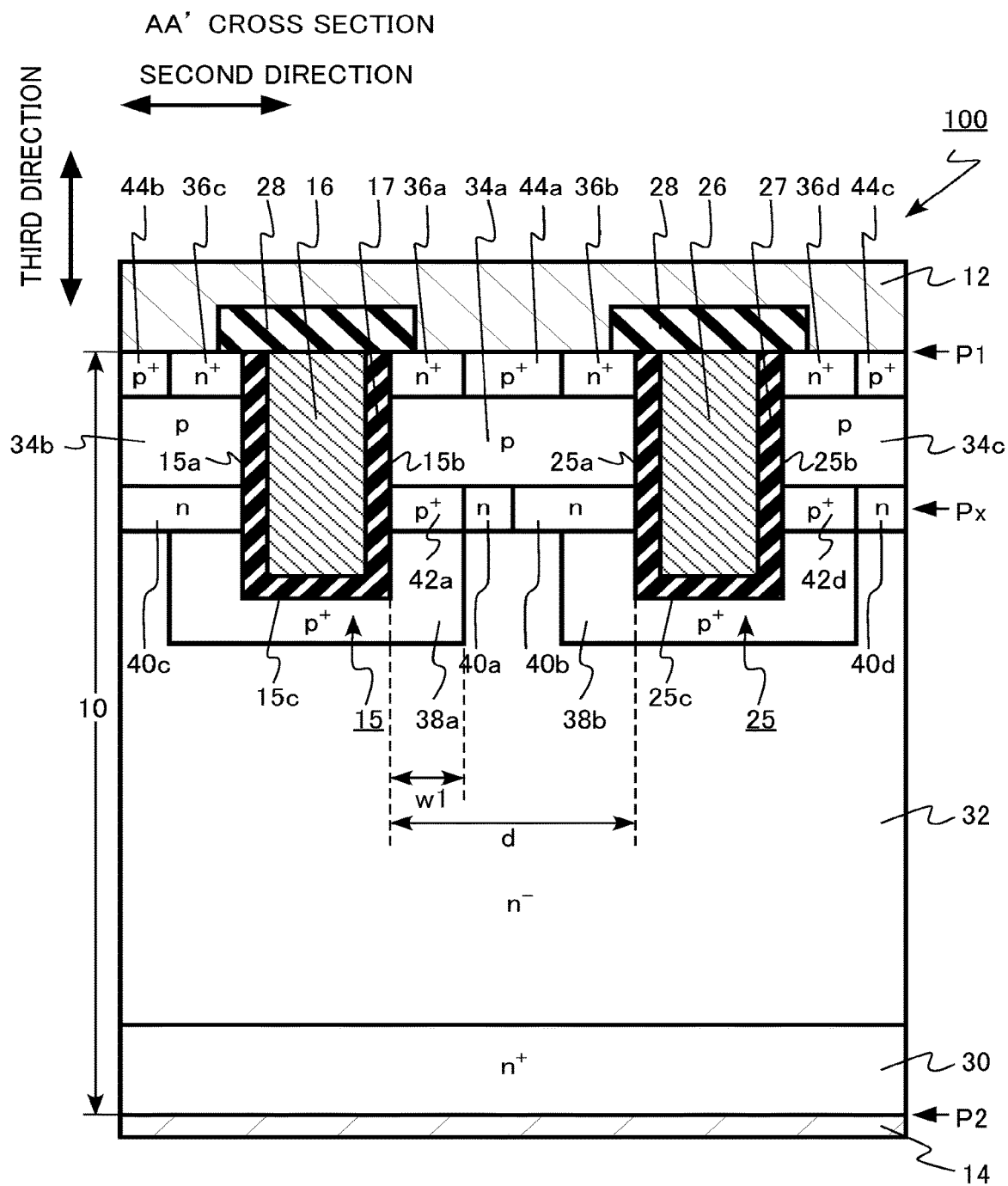
FIG. 1 is a schematic cross-sectional view of a semiconductor device of a first embodiment.

A semiconductor device according to an embodiment includes a silicon carbide layer having a first plane and a second plane facing the first plane, the first plane and the second plane being parallel to a first direction and a second direction perpendicular to the first direction; a first trench provided in the silicon carbide layer, the first trench extending in the first direction on the first plane, and the first trench having a first side plane, a second side plane, and a first bottom plane between the first side plane and the second side plane; a first gate electrode located in the first trench; a first gate insulating layer located between the first gate electrode and the silicon carbide layer; a second trench provided in the silicon carbide layer, the second trench extending in the first direction on the first plane, and the second trench having a third side plane facing the second side plane, a fourth side plane, and a second bottom plane between the third side plane and the fourth side plane; a second gate electrode located in the second trench; a second gate insulating layer located between the second gate electrode and the silicon carbide layer; a first silicon carbide region of n-type located in the silicon carbide layer; a second silicon carbide region of p-type located in the silicon carbide layer, the second silicon carbide region being located between the first silicon carbide region and the first plane, and the second silicon carbide region being located between the first trench and the second trench; a third silicon carbide region of n-type located in the silicon carbide layer and located between the second silicon carbide region and the first plane; a fourth silicon carbide region of n-type located in the silicon carbide layer and located between the second silicon carbide region and the first plane, the third silicon carbide region being interposed between the first trench and the fourth silicon carbide region; a fifth silicon carbide region of p-type located in the silicon carbide layer and located between the first silicon carbide region and the first trench, the fifth silicon carbide region covering the first bottom plane; a sixth silicon carbide region of p-type located in the silicon carbide layer and located between the first silicon carbide region and the second trench, the sixth silicon carbide region covering the second bottom plane, and the first silicon carbide region being interposed between the fifth silicon carbide region and the sixth silicon carbide region; a seventh silicon carbide region of n-type located in the silicon carbide layer and located between the fifth silicon carbide region and the second silicon carbide region; an eighth silicon carbide region of n-type located in the silicon carbide layer and located between the sixth silicon carbide region and the second silicon carbide region; a plurality of ninth silicon carbide regions of p-type located in the silicon carbide layer and located between the fifth silicon carbide region and the second silicon carbide region, the ninth silicon carbide regions being in contact with the fifth silicon carbide region and the second silicon carbide region, and the ninth silicon carbide regions being repeatedly disposed in the first direction; and a plurality of tenth silicon carbide regions of p-type located in the silicon carbide layer and located between the sixth silicon carbide region and the second silicon carbide region, the tenth silicon carbide regions being in contact with the sixth silicon carbide region and the second silicon carbide region, and the tenth silicon carbide regions being repeatedly disposed in the first direction, wherein a virtual line segment connecting the ninth silicon carbide region and the tenth silicon carbide region and being parallel to the first plane is oblique with respect to the second direction.

Hereinafter, embodiments of the present disclosure will be described with reference to the drawings. In the following description, the same or similar members and the like are denoted by the same reference numerals, and the explanation of the members and the like once described is omitted as appropriate.

In addition, in the following description, when notations $n^+$, $n^-$ and $p^+$, $p^-$ are used, these notations represent relative high and low of impurity concentration in each conductivity type. That is, it is indicated that $n^+$ has a relatively higher n-type impurity concentration than n, and $n^-$ has a relatively lower n-type impurity concentration than n. In addition, it is indicated that $p^+$ has a relatively higher p-type impurity concentration than p, and $p^-$ has a relatively lower p-type impurity concentration than p. Note that sometimes the $n^+$ type and $n^-$ type are simply described as n-type, $p^+$ type and $p^-$ type simply as p-type.

The impurity concentration can be measured by SIMS (Secondary Ion Mass Spectrometry), for example. Further, the relative height of the impurity concentration can also be judged from the high or low of the carrier concentration obtained by, for example, SCM (Scanning Capacitance Microscopy). Further, the distance such as the depth of the impurity region can be obtained by SIMS, for example. In addition, the distance such as the width and the depth of the impurity region can be obtained from an SCM image, for example.

The shape of the trench, the thickness of the insulating layer, and the like can be measured on, for example, a TEM (Transmission Electron Microscope) image.

First Embodiment

The semiconductor device of the first embodiment includes a silicon carbide layer having a first plane parallel to a first direction and a second direction perpendicular to the first direction and a second plane parallel to the first plane; a first trench being provided in the silicon carbide layer, extending in the first direction on the first plane, and having a first side plane, a second side plane, and a first bottom plane between the first side plane and the second side plane; a first gate electrode located in the first trench; a first gate insulating layer located between the first gate electrode and the silicon carbide layer; a second trench being provided in the silicon carbide layer, extending in the first direction on the first plane, and having a third side plane facing the second side plane, a fourth side plane, and a second bottom plane between the third side plane and the fourth side plane; a second gate electrode located in the second trench; a second gate insulating layer located between the second gate electrode and the silicon carbide layer; an n-type first silicon carbide region located in the silicon carbide layer; a p-type second silicon carbide region located in the silicon carbide layer, located between the first silicon carbide region and the first plane, and located between the first trench and the second trench; an n-type third silicon carbide region located in the silicon carbide layer and located between the second silicon carbide region and the first plane; an n-type fourth silicon carbide region being located in the silicon carbide layer and located between the second silicon carbide region and the first plane, and interposing the third silicon carbide region between the first trench and the fourth silicon carbide region; a p-type fifth silicon carbide region being located in the silicon carbide layer and located between the first silicon carbide region and the first trench, and covering the first bottom plane; a p-type sixth silicon carbide region being located in the silicon carbide layer and located between the first silicon carbide region and the second trench, covering the second bottom plane, and interposing the first silicon carbide region between the fifth silicon carbide region and the sixth silicon carbide region; an n-type seventh silicon carbide region located in the silicon carbide layer and located between the fifth silicon carbide region and the second silicon carbide region; an n-type eighth silicon carbide region located in the silicon carbide layer and located between the sixth silicon carbide region and the second silicon carbide region; a plurality of p-type ninth silicon carbide regions being located in the silicon carbide layer and located between the fifth silicon carbide region and the second silicon carbide region, being in contact with the fifth silicon carbide region and the second silicon carbide region, and being repeatedly disposed in the first direction; and a plurality of p-type tenth silicon carbide regions being located in the silicon carbide layer and located between the sixth silicon carbide region and the second silicon carbide region, being in contact with the sixth silicon carbide region and the second silicon carbide region, and being repeatedly disposed in the first direction, wherein a virtual line segment connecting the ninth silicon carbide region and the tenth silicon carbide region and being parallel to the first plane is oblique with respect to the second direction.

FIG. 1 is a schematic cross-sectional view of a semiconductor device of the first embodiment. The semiconductor device of the first embodiment is a trench gate type vertical MOSFET 100 using silicon carbide. The MOSFET 100 is an n-channel type MOSFET using electrons as a carrier.

Figure 2:
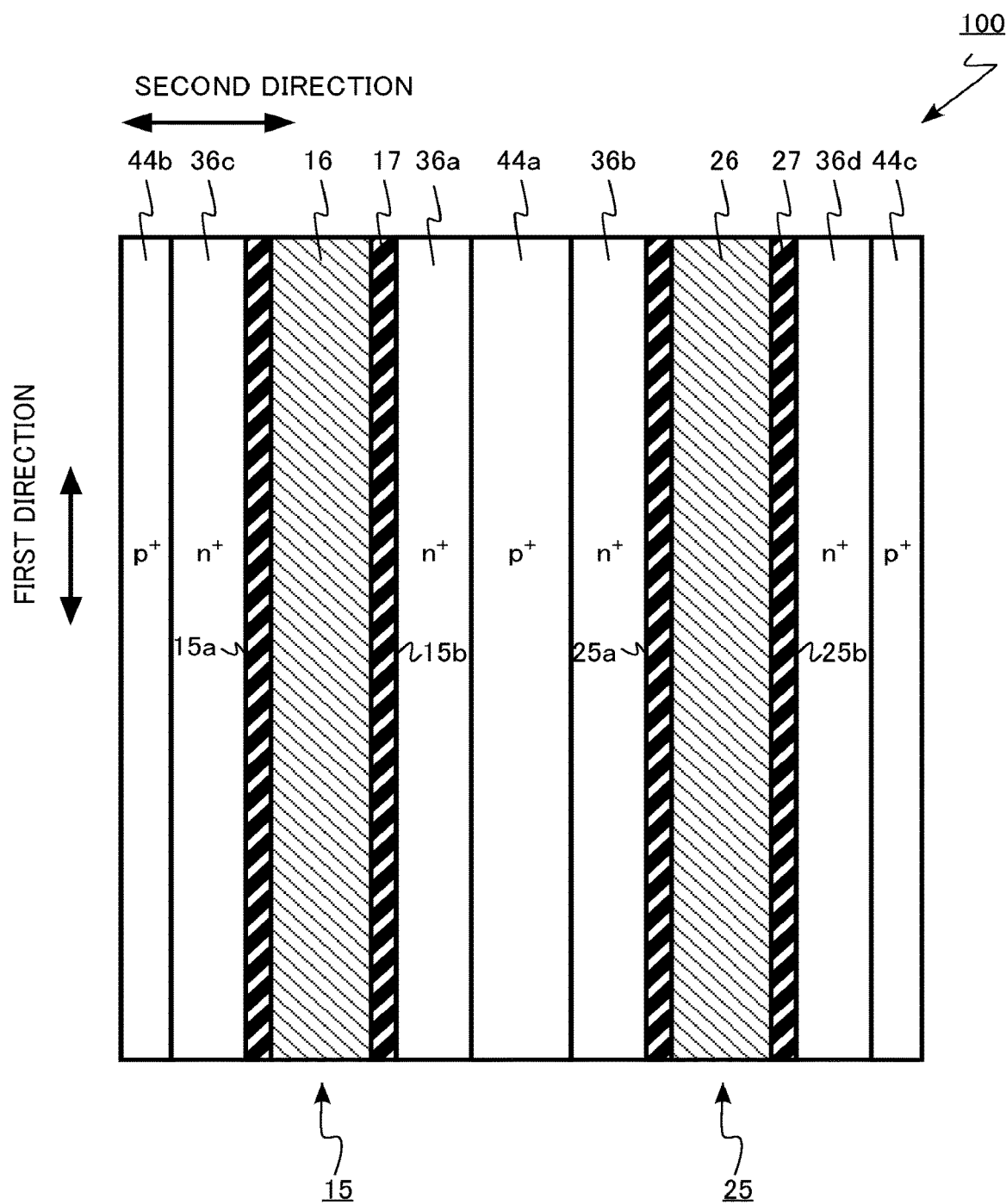
FIG. 2 is a schematic plan view of the semiconductor device of the first embodiment.

FIG. 2 is a schematic plan view of the semiconductor device of the first embodiment. FIG. 2 is a plan view of the first plane (P1 in FIG. 1) of FIG. 1. The first direction and the second direction are parallel to the first plane P1. The second direction is perpendicular to the first direction.

Figure 3:
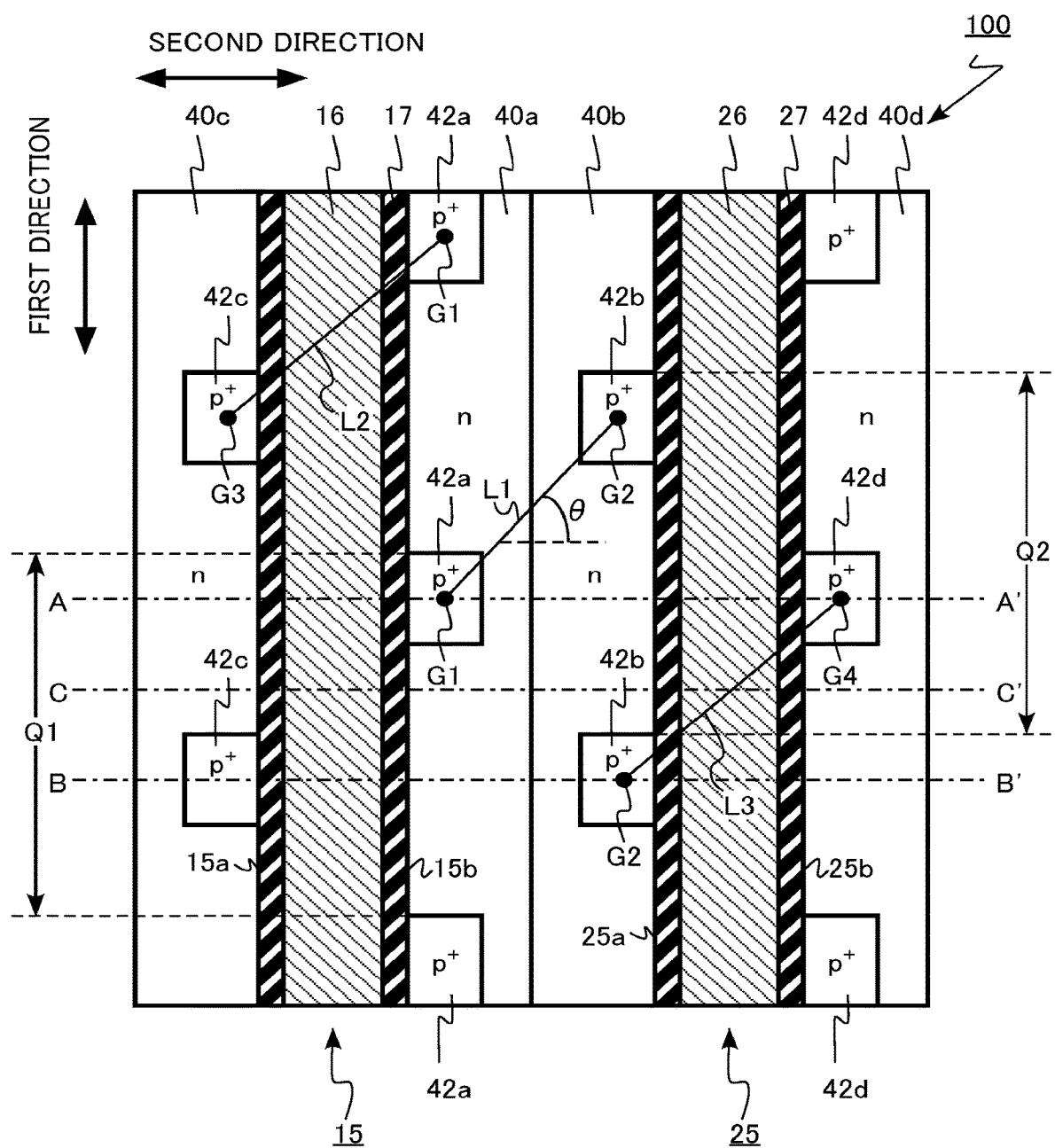
FIG. 3 is a schematic cross-sectional view of the semiconductor device of the first embodiment.

FIG. 3 is a schematic cross-sectional view of the semiconductor device of the first embodiment. FIG. 3 is a cross section taken along Px of FIG. 1. FIG. 3 is a cross section parallel to the first direction and the second direction. FIG. 3 is a cross section parallel to the first plane P1. FIG. 1 is a cross section taken along the line AA' in FIG. 3.

Figure 4:
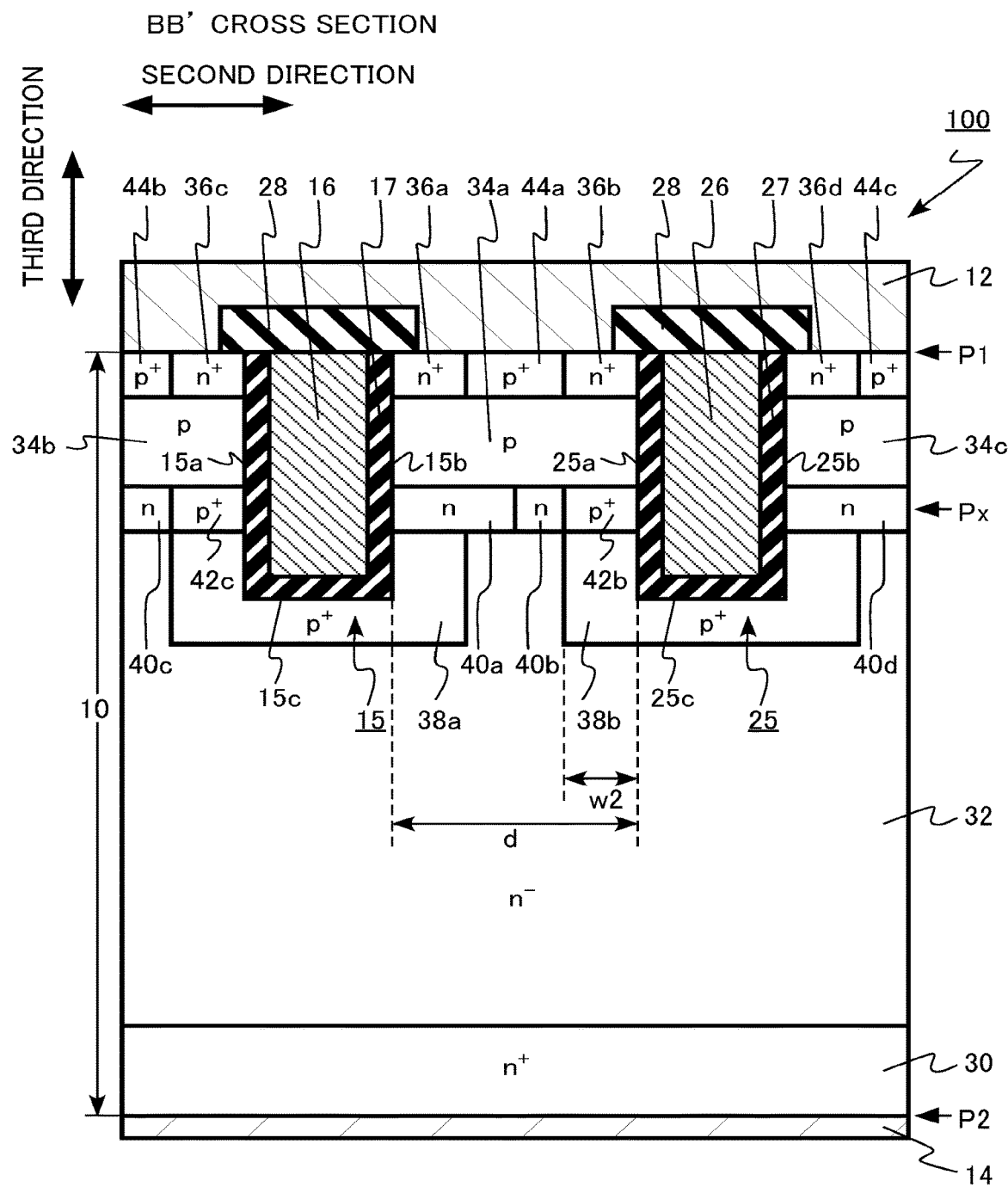
FIG. 4 is a schematic cross-sectional view of the semiconductor device of the first embodiment.
Figure 5:
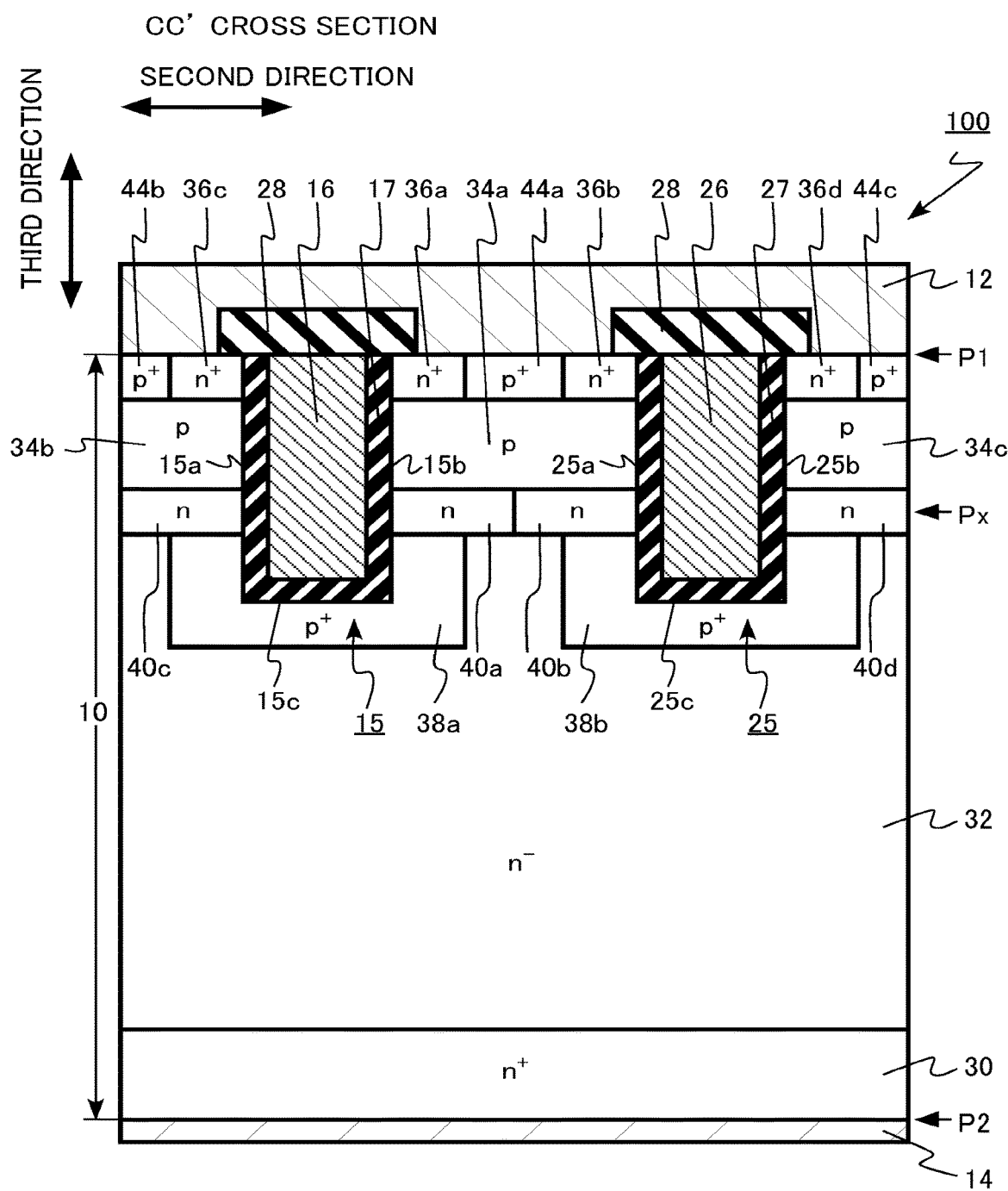
FIG. 5 is a schematic cross-sectional view of the semiconductor device of the first embodiment.

FIG. 4 is a schematic cross-sectional view of the semiconductor device of the first embodiment. FIG. 4 is a cross section taken along the line BB' of FIG. 3. FIG. 5 is a schematic cross-sectional view of the semiconductor device of the first embodiment. FIG. 5 is a cross section taken along the line CC' of FIG. 3.

The MOSFET 100 includes a silicon carbide layer 10, a source electrode 12, a drain electrode 14, a first trench 15, a first gate electrode 16, a first gate insulating layer 17, a second trench 25, a second gate electrode 26, a second gate insulating layer 27, and an interlayer insulating layer 28.

In the silicon carbide layer 10, an $n^+$-type drain region 30, an $n^-$-type drift region 32 (a first silicon carbide region), a p-type first body region 34a (a second silicon carbide region), a p-type second body region 34b (an eleventh silicon carbide region), a p-type third body region 34c (a fifteenth silicon carbide region), an $n^+$-type first source region 36a (a third silicon carbide region), an $n^+$-type second source region 36b (a fourth silicon carbide region), an $n^+$-type third source region 36c (a twelfth silicon carbide region), an $n^+$-type fourth source region 36d (a sixteenth silicon carbide region), a $p^+$-type first electric field relaxation region 38a (a fifth silicon carbide region), a $p^+$-type second electric field relaxation region 38b (a sixth silicon carbide region), an n-type first current dispersion region 40a (a seventh silicon carbide region), an n-type second current dispersion region 40b (an eighth silicon carbide region), an n-type third current dispersion region 40c (a thirteenth silicon carbide region), an n-type fourth current dispersion region 40d (a seventeenth silicon carbide region), a $p^+$-type first connection region 42a (a ninth silicon carbide region), a $p^+$-type second connection region 42b (a tenth silicon carbide region), a $p^+$-type third connection region 42c (a fourteenth silicon carbide region), a $p^+$-type fourth connection region 42d (an eighteenth silicon carbide region), a $p^+$-type first contact region 44a, a $p^+$-type second contact region 44b, and a $p^+$-type third contact region 44c are provided.

The silicon carbide layer 10 is single crystal SiC. The silicon carbide layer 10 is, for example, 4H—SiC.

The silicon carbide layer 10 has a first plane ("P1" in FIG. 1) and a second plane ("P2" in FIG. 1). Hereinafter, the first plane P1 is also referred to as a front surface and the second plane P2 is referred to as a back surface. Hereinafter, "depth" means a depth in a direction toward the second plane P2 with reference to the first plane P1.

In FIGS. 1 and 2, the first direction and the second direction are parallel to the first plane P1 and the second plane P2. The third direction is perpendicular to the first plane P1 and the second plane P2.

For example, the first plane P1 is a plane inclined at 0 degrees or more and 8 degrees or less with respect to a (0001) face. That is, the first plane P1 is a plane in which the normal is inclined at 0 degrees or more and 8 degrees or less with respect to a c axis in the [0001] direction. In other words, the off angle with respect to the (0001) face is 0 degrees or more and 8 degrees or less. Further, the second plane P2 is, for example, a plane inclined at an angle of 0 degrees or more and 8 degrees or less with respect to a (000-1) face.

The (0001) face is called a silicon face. The (000-1) face is called a carbon face. The inclination direction of the first plane P1 and the second plane P2 is, for example, a [11-20] direction. The [11-20] direction is the a-axis direction. In FIG. 1, for example, the second direction shown in the drawing is the a-axis direction.

The first trench 15 and the second trench 25 are provided in the silicon carbide layer 10. The first trench 15 and the second trench 25 extend in the first direction as shown in FIG. 2. The depths of the first trench 15 and the second trench 25 are, for example, 1 µm or more and 2 µm or less. A plurality of trenches including the first trench 15 and the second trench 25 are repeatedly disposed in the second direction. The repetitive pitch in the second direction of the trench is, for example, 2 µm or more and 6 µm or less.

The first trench 15 has a first side plane 15a, a second side plane 15b, and a first bottom plane 15c. The first bottom plane 15c is provided between the first side plane 15a and the second side plane 15b.

The first gate electrode 16 is provided in the first trench 15. The first gate electrode 16 is provided between the source electrode 12 and the drain electrode 14. The first gate electrode 16 extends in the first direction.

The first gate insulating layer 17 is provided between the first gate electrode 16 and the silicon carbide layer 10. The first gate insulating layer 17 is provided between each region of the first source region 36a, the third source region 36c, the first body region 34a, the second body region 34b, the first current dispersion region 40a, the third current dispersion region 40c, the first connection region 42a, the third connection region 42c, and the first electric field relaxation region 38a and the first gate electrode 16.

The second trench 25 has a third side plane 25a, a fourth side plane 25b, and a second bottom plane 25c. The second bottom plane 25c is provided between the third side plane 25a and the fourth side plane 25b.

The second gate electrode 26 is provided in the second trench 25. The second gate electrode 26 is provided between the source electrode 12 and the drain electrode 14. The second gate electrode 26 extends in the first direction.

The second gate insulating layer 27 is provided between the second gate electrode 26 and the silicon carbide layer 10. The second gate insulating layer 27 is provided between each region of the second source region 36b, the fourth source region 36d, the first body region 34a, the third body region 34c, the second current dispersion region 40b, the fourth current dispersion region 40d, the second connection region 42b, the fourth connection region 42d, and the second electric field relaxation region 38b and the second gate electrode 26.

The first gate electrode 16 and the second gate electrode 26 are conductive layers. The first gate electrode 16 and the second gate electrode 26 are, for example, polycrystalline silicon containing a p-type impurity or an n-type impurity.

The first gate insulating layer 17 and the second gate insulating layer 27 are, for example, silicon oxide films. For example, a high-k insulating film (high dielectric constant insulating film such as HfSiON, ZrSiON, AlON) can be applied to the first gate insulating layer 17 and the second gate insulating layer 27. For example, a laminated film of a silicon oxide film ($SiO_2$) and a high-K insulating film can also be applied to the first gate insulating layer 17 and the second gate insulating layer 27.

The interlayer insulating layer 28 is provided on the first gate electrode 16 and the second gate electrode 26. The interlayer insulating layer 20 is, for example, a silicon oxide film.

The source electrode 12 is provided on the front surface side of the silicon carbide layer 10. The source electrode 12 is provided on the front surface of the silicon carbide layer 10. The source electrode 12 is in contact with the first source region 36a, the second source region 36b, the third source region 36c, the fourth source region 36d, the first contact region 44a, the second contact region 44b, and the third contact region 44c.

The source electrode 12 contains a metal. The metal forming the source electrode 12 is, for example, a laminated structure of titanium (Ti) and aluminum (Al). The source electrode 12 may contain metal silicide or metal carbide in contact with the silicon carbide layer 10.

The drain electrode 14 is provided on the back surface side of the silicon carbide layer 10. The drain electrode 14 is provided on the back surface of the silicon carbide layer 10. The drain electrode 14 is in contact with the drain region 30.

The drain electrode 14 is, for example, a metal or a metal semiconductor compound. The drain electrode 14 contains a material selected from the group consisting of, for example, nickel silicide (NiSi), titanium (Ti), nickel (Ni), silver (Ag), and gold (Au).

The $n^+$-type drain region 30 is provided on the back surface side of the silicon carbide layer 10. The drain region 30 contains, for example, nitrogen (N) as an n-type impurity. The n-type impurity concentration of the drain region 30 is, for example, $1\times10^{18}$ $cm^{-3}$ or more and $1\times10^{21}$ $cm^{-3}$ or less.

The $n^-$-type drift region 32 is provided on the drain region 30. The drift region 32 is provided between the drain region 30 and the front surface of the silicon carbide layer 10.

The drift region 32 contains, for example, nitrogen (N) as an n-type impurity. The n-type impurity concentration of the drift region 32 is, for example, $4\times10^{14}$ $cm^{-3}$ or more and $1\times10^{17}$ $cm^{-3}$ or less. The thickness of the drift region 32 in the third direction is, for example, 5 μm or more and 150 μm or less.

The p-type first body region 34a is provided between the drift region 32 and the front surface of the silicon carbide layer 10. The first body region 34a is provided between the first trench 15 and the second trench 25. The first body region 34a is in contact with the second side plane 15b and the third side plane 25a.

The p-type second body region 34b is provided between the drift region 32 and the front surface of the silicon carbide layer 10. The first trench 15 is interposed between the second body region 34b and the first body region 34a. The second body region 34b is in contact with the first side plane 15a.

The p-type third body region 34c is provided between the drift region 32 and the front surface of the silicon carbide layer 10. The second trench 25 is interposed between the third body region 34c and the second body region 34b. The third body region 34c is in contact with the fourth side plane 25b.

The first body region 34a, the second body region 34b, and the third body region 34c function as a channel region of the MOSFET 100. For example, when the MOSFET 100 is turned on, channels in which electrons flow are formed in regions of the first body region 34a and the second body region 34b which are in contact with the gate insulating layer 17 and regions of the second body region 34b and the third body region 34c which are in contact with the gate insulating layer 27. The regions of the first body region 34a and the second body region 34b which are in contact with the first gate insulating layer 17 and the regions of the second body region 34b and the third body region 34c which are in contact with the second gate insulating layer 27 are channel formation regions.

The first body region 34a, the second body region 34b, and the third body region 34c contain, for example, aluminum (Al) as a p-type impurity. The p-type impurity concentrations of the first body region 34a, the second body region 34b, and the third body region 34c are, for example, $5\times10^{16}$ $cm^{-3}$ or more and $5\times10^{17}$ $cm^{-3}$ or less.

The depths of the first body region 34a, the second body region 34b, and the third body region 34c are, for example, 0.2 μm or more and 1.0 μm or less.

The $n^+$-type first source region 36a is provided between the first body region 34a and the front surface of the silicon carbide layer 10. The first source region 36a is in contact with the source electrode 12. The first source region 36a is in contact with the first gate insulating layer 17. The first source region 36a is in contact with the second side plane 15b.

The $n^+$-type second source region 36b is provided between the first body region 34a and the front surface of the silicon carbide layer 10. The first source region 36a is interposed between the second source region 36b and the first trench 15. The second source region 36b is in contact with the source electrode 12. The second source region 36b is in contact with the second gate insulating layer 27. The second source region 36b is in contact with the third side plane 25a.

The $n^+$-type third source region 36c is provided between the second body region 34b and the front surface of the silicon carbide layer 10. The first trench 15 is interposed between the third source region 36c and the first source region 36a. The third source region 36c is in contact with the source electrode 12. The third source region 36c is in contact with the first gate insulating layer 17. The third source region 36c is in contact with the first side plane 15a.

The $n^+$-type fourth source region 36d is provided between the third body region 34c and the front surface of the silicon carbide layer 10. The second trench 25 is Interposed between the fourth source region 36d and the second source region 36b. The fourth source region 36d is in contact with the source electrode 12. The fourth source region 36d is in contact with the second gate insulating layer 27. The fourth source region 36d is in contact with the fourth side plane 25b.

The n-type impurity concentrations of the first source region 36a, the second source region 36b, the third source region 36c, and the fourth source region 36d are, for example, $1\times10^{19}$ $cm^{-3}$ or more and $1\times10^{21}$ $cm^{-3}$ or less. The depths of the first source region 36a, the second source region 36b, the third source region 36c, and the fourth source region 36d are shallower than the depths of the first body region 34a, the second body region 34b, and the third body region 34c, for example, 0.1 µm or more and 0.3 µm or less. The distances between the drift region 32 and the first source region 36a, the second source region 36b, the third source region 36c, and the fourth source region 36d are, for example, 0.1 µm or more and 0.9 µm or less.

The p+-type first contact region 44a is provided between the first body region 34a and the front surface of the silicon carbide layer 10. The first contact region 44a is in contact with the source electrode 12.

The p+-type second contact region 44b is provided between the second body region 34b and the front surface of the silicon carbide layer 10. The second contact region 44b is in contact with the source electrode 12.

The p+-type third contact region 44c is provided between the third body region 34c and the front surface of the silicon carbide layer 10. The third contact region 44c is in contact with the source electrode 12.

The first contact region 44a, the second contact region 44b, and the third contact region 44c contain, for example, aluminum (Al) as a p-type impurity. The p-type impurity concentrations in the first contact region 44a, the second contact region 44b, and the third contact region 44c are, for example, higher than the p-type impurity concentrations in the first body region 34a, the second body region 34b, and the third body region 34c.

The first contact region 44a, the second contact region 44b, and the third contact region 44c are, for example, $1 \times 10^{18}$ cm$^{-3}$ or more and $1 \times 10^{21}$ cm$^{-3}$ or less. In addition, the contact portion with the source electrode 12 is preferably high concentration, for example, $1 \times 10^{19}$ cm$^{-3}$ or more and $1 \times 10^{21}$ cm$^{-3}$ or less.

The p+-type first electric field relaxation region 38a is provided between the drift region 32 and the first trench 15. The first electric field relaxation region 38a covers the first bottom plane 15c of the first trench 15. The first electric field relaxation region 38a is in contact with the first bottom plane 15c, a part of the first side plane 15a, and a part of the second side plane 15b of the first trench 15.

The p+-type second electric field relaxation region 38b is provided between the drift region 32 and the second trench 25. The second electric field relaxation region 38b covers the second bottom plane 25c of the second trench 25. The second electric field relaxation region 38b is in contact with the second bottom plane 25c, a part of the third side plane 25a, and a part of the fourth side plane 25b of the second trench 25. A part of the drift region 32 is interposed between the second electric field relaxation region 38b and the first electric field relaxation region 38a.

The first electric field relaxation region 38a and the second electric field relaxation region 38b contain, for example, aluminum (Al) as a p-type impurity. The p-type impurity concentrations in the first electric field relaxation region 38a and the second electric field relaxation region 38b are, for example, higher than the p-type impurity concentrations in the first body region 34a, the second body region 34b, and the third body region 34c. The p-type impurity concentrations in the first electric field relaxation region 38a and the second electric field relaxation region 38b are, for example, $1 \times 10^{17}$ cm$^{-3}$ or more and $1 \times 10^{20}$ cm$^{-3}$ or less.

The potentials of the first electric field relaxation region 38a and the second electric field relaxation region 38b are fixed to the source potential. The first electric field relaxation region 38a and the second electric field relaxation region 38b have a function of relaxing an electric field applied to the first gate insulating layer 17 and the second gate insulating layer 27, respectively. In particular, they have a function of relaxing the electric field applied to the first gate insulating layer 17 at the bottom of the first trench 15 and the second gate insulating layer 27 at the bottom of the second trench 25.

The n-type first current dispersion region 40a is provided between the first electric field relaxation region 38a and the first body region 34a. At least a part of the first current dispersion region 40a is in contact with the second side plane 15b of the first trench 15. The first current dispersion region 40a is provided between the first trench 15 and the second trench 25.

The n-type second current dispersion region 40b is provided between the second electric field relaxation region 38b and the first body region 34a. At least a part of the second current dispersion region 40b is in contact with the third side plane 25a of the second trench 25. The second current dispersion region 40b is provided between the first trench 15 and the second trench 25. The second current dispersion region 40b is in contact with the first current dispersion region 40a between the first trench 15 and the second trench 25.

The n-type third current dispersion region 40c is provided between the first electric field relaxation region 38a and the second body region 34b. At least a part of the third current dispersion region 40c is in contact with the first side plane 15a of the first trench 15.

The n-type fourth current dispersion region 40d is provided between the second electric field relaxation region 38b and the third body region 34c. At least a part of the fourth current dispersion region 40d is in contact with the fourth side plane 25b of the second trench 25.

The first current dispersion region 40a, the second current dispersion region 40b, the third current dispersion region 40c, and the fourth current dispersion region 40d contain, for example, nitrogen (N) as an n-type impurity. The n-type impurity concentrations in the first current dispersion region 40a, the second current dispersion region 40b, the third current dispersion region 40c, and the fourth current dispersion region 40d are higher than the n-type impurity concentration in the drift region 32.

The n-type impurity concentrations in the first current dispersion region 40a, the second current dispersion region 40b, the third current dispersion region 40c, and the fourth current dispersion region 40d are, for example, $4 \times 10^{16}$ cm$^{-3}$ or more and $1 \times 10^{18}$ cm$^{-3}$ or less. The thicknesses in the third direction of the first current dispersion region 40a, the second current dispersion region 40b, the third current dispersion region 40c, and the fourth current dispersion region 40d are, for example, 0.1 µm or more and 0.5 µm or less.

The first current dispersion region 40a, the second current dispersion region 40b, the third current dispersion region 40c, and the fourth current dispersion region 40d have, when the MOSFET 100 is turned on, a function of reducing the on-resistance by dispersing electrons flowing from the first body region 34a, the second body region 34b, and the third body region 34c to the drift region 32.

The p+-type first connection region 42a is provided between the first electric field relaxation region 38a and the first body region 34a. The first connection region 42a is in contact with the first electric field relaxation region 38a and the first body region 34a. The first connection region 42a is provided between the second side plane 15b of the first trench 15 and the third side plane 25a of the second trench. The first connection region 42a is in contact with the second side plane 15b of the first trench 15. The first current dispersion region 40a and the second current dispersion region 40b are provided between the first connection region 42a and the third side plane 25a.

The plurality of first connection regions 42a is repeatedly disposed in the first direction. For example, the plurality of first connection regions 42a is repeatedly disposed in the first direction at a constant first pitch (Q1 in FIG. 3). For example, the width of the first connection region 42a in the first direction is smaller than the interval of the adjacent first connection regions 42a in the first direction.

The width (w1 in FIG. 1) of the first connection region 42a in the second direction is, for example, one-fourth or more and a half or less of the interval (d in FIG. 1) between the first trench 15 and the second trench 25.

The $p^+$-type second connection region 42b is provided between the second electric field relaxation region 38b and the first body region 34a. The second connection region 42b is in contact with the second electric field relaxation region 38b and the first body region 34a. The second connection region 42b is provided between the second side plane 15b of the first trench 15 and the third side plane 25a of the second trench. The second connection region 42b is in contact with the third side plane 25a of the second trench 25. The first current dispersion region 40a and the second current dispersion region 40b are provided between the second connection region 42b and the second side plane 15b.

The plurality of second connection regions 42b is repeatedly disposed in the first direction. The plurality of second connection regions 42b is repeatedly disposed in the first direction at, for example, a constant second pitch (Q2 in FIG. 3). For example, the second pitch Q2 of disposition of the second connection regions 42b and the first pitch Q1 of disposition of the first connection regions 42a are the same. For example, the width of the second connection region 42b in the first direction is smaller than the interval of the adjacent second connection regions 42b in the first direction.

The width (w2 in FIG. 4) of the second connection region 42b in the second direction is, for example, one-fourth or more and a half or less of the interval (d in FIG. 4) between the first trench 15 and the second trench 25.

A virtual line segment (L1 in FIG. 3) which connects the first connection region 42a and the second connection region 42b and is parallel to the first plane P1 is oblique with respect to the second direction. The virtual line segment L1 is, for example, a line segment which connects the geometric center of gravity (G1 in FIG. 3) of the first connection region 42a and the geometric center of gravity (G2 in FIG. 3) of the second connection region 42b in the cross section parallel to the first plane P1. The angle (e in FIG. 3) between the virtual line segment L1 and the second direction is, for example, 10 degrees or more and 80 degrees or less.

The first connection regions 42a and the second connection regions 42b are alternately disposed in the first direction. For example, the disposition pitches of the first connection regions 42a and the second connection regions 42b are shifted in the first direction. For example, the first connection regions 42a and the second connection regions 42b are disposed shifted by a half pitch. The positions of the first connection regions 42a and the second connection regions 42b are shifted from each other in the first direction.

The $p^+$-type third connection region 42c is provided between the first electric field relaxation region 38a and the second body region 34b. The third connection region 42c is in contact with the first electric field relaxation region 38a and the second body region 34b. The third connection region 42c is provided between the third current dispersion region 40c and the first side plane 15a of the first trench 15. The third connection region 42c is in contact with the first side plane 15a of the first trench 15.

The plurality of third connection regions 42c is repeatedly disposed in the first direction. The plurality of third connection regions 42c are repeatedly disposed in the first direction at the same pitch as that of the first connection regions 42a. For example, the width of the third connection region 42c in the first direction is smaller than the interval of the adjacent third connection regions 42c in the first direction.

A virtual line segment (L2 in FIG. 3) which connects the first connection region 42a and the third connection region 42c and is parallel to the first plane P1 is oblique with respect to the second direction. The virtual line segment L2 is, for example, a line segment which connects the geometric center of gravity (G1 in FIG. 3) of the first connection region 42a and the geometric center of gravity (G3 in FIG. 3) of the third connection region 42c in the cross section parallel to the first plane P1.

The $p^+$-type fourth connection region 42d is provided between the second electric field relaxation region 38b and the third body region 34c. The fourth connection region 42d is in contact with the second electric field relaxation region 38b and the third body region 34c. The fourth connection region 42d is provided between the fourth current dispersion region 40d and the fourth side plane 25b of the second trench 25. The fourth connection region 42d is in contact with the fourth side plane 25b.

The plurality of fourth connection regions 42d is repeatedly disposed in the first direction. The plurality of fourth connection regions 42d are repeatedly disposed in the first direction at substantially equal pitch as that of the second connection regions 42b. For example, the width of the fourth connection region 42d in the first direction is smaller than the interval of the adjacent fourth connection regions 42d in the first direction.

A virtual line segment (L3 in FIG. 3) which connects the second connection region 42b and the fourth connection region 42d and is parallel to the first plane P1 is oblique with respect to the second direction. The virtual line segment L3 is, for example, a line segment which connects the geometric center of gravity (G2 in FIG. 3) of the second connection region 42b and the geometric center of gravity (G4 in FIG. 3) of the fourth connection region 42d in the cross section parallel to the first plane P1.

The first connection region 42a, the second connection region 42b, the third connection region 42c, and the fourth connection region 42d contain, for example, aluminum (Al) as a p-type impurity, for example. The p-type impurity concentrations in the first connection region 42a, the second connection region 42b, the third connection region 42c, and the fourth connection region 42d are, for example, higher than the p-type impurity concentrations in the first body region 34a, the second body region 34b, and the third body region 34c. The p-type impurity concentrations in the first connection region 42a, the second connection region 42b, the third connection region 42c, and the fourth connection region 42d are, for example, $1\times10^{17}$ cm$^{-3}$ or more and $1\times10^{20}$ cm$^{-3}$ or less.

The thicknesses in the third direction of the first connection region 42a, the second connection region 42b, the third connection region 42c, and the fourth connection region 42d are, for example, 0.1 µm or more and 0.5 µm or less.

The first connection region 42a has a function of electrically connecting the first electric field relaxation region 38a and the first body region 34a. By the first connection region 42a, the first electric field relaxation region 38a is fixed to the source potential.

The second connection region 42b has a function of electrically connecting the second electric field relaxation region 38b and the first body region 34a. By the second connection region 42b, the second electric field relaxation region 38b is fixed to the source potential.

The third connection region 42c has a function of electrically connecting the first electric field relaxation region 38a and the second body region 34b. By the third connection region 42c, the first electric field relaxation region 38a is fixed to the source potential.

The fourth connection region 42d has a function of electrically connecting the second electric field relaxation region 38b and the third body region 34c. By the fourth connection region 42d, the second electric field relaxation region 38b is fixed to the source potential.

The first electric field relaxation region 38a and the second electric field relaxation region 38b are fixed to the source potential, and thereby the operation of the MOSFET 100 is stabilized.

Next, an example of a method of manufacturing the semiconductor device of the first embodiment will be described.

FIGS. 6, 7, 8, 9, 10, and 11 are schematic cross-sectional views showing an example of the method of manufacturing the semiconductor device of the first embodiment. FIGS. 6, 7, 8, 9, 10, and 11 show cross sections corresponding to FIG. 1.

First, a silicon carbide layer having an $n^+$-type drain region 30 and an $n^-$-type first epitaxial layer 161 is prepared. A part of the first epitaxial layer 161 finally becomes a drift region 32.

Figure 6:
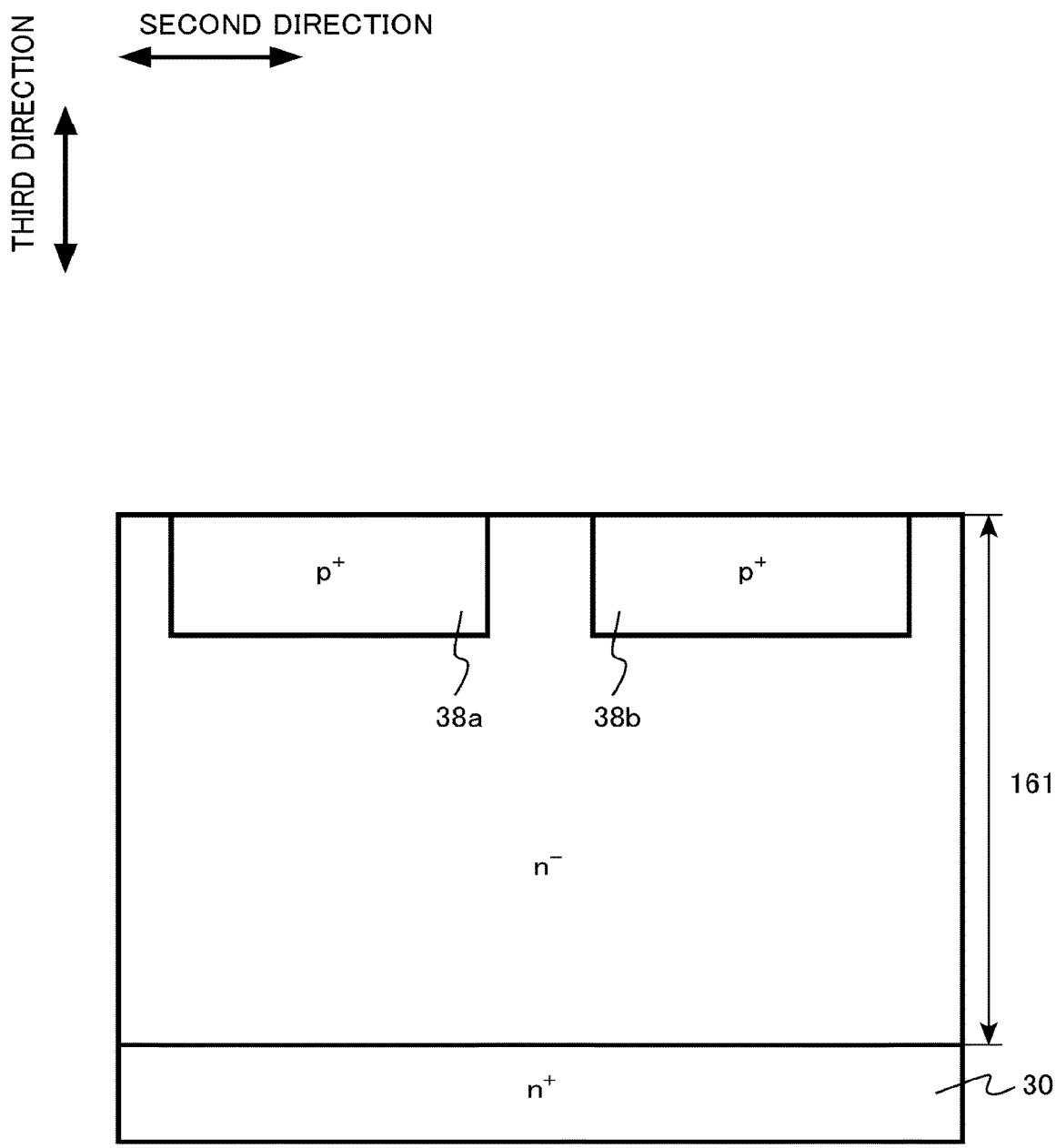
FIG. 6 is a schematic cross-sectional view showing an example of a method of manufacturing the semiconductor device of the first embodiment.

Next, the first electric field relaxation region 38a and the second electric field relaxation region 38b are formed in the first epitaxial layer 161 by an ion implantation method (FIG. 6).

Figure 7:
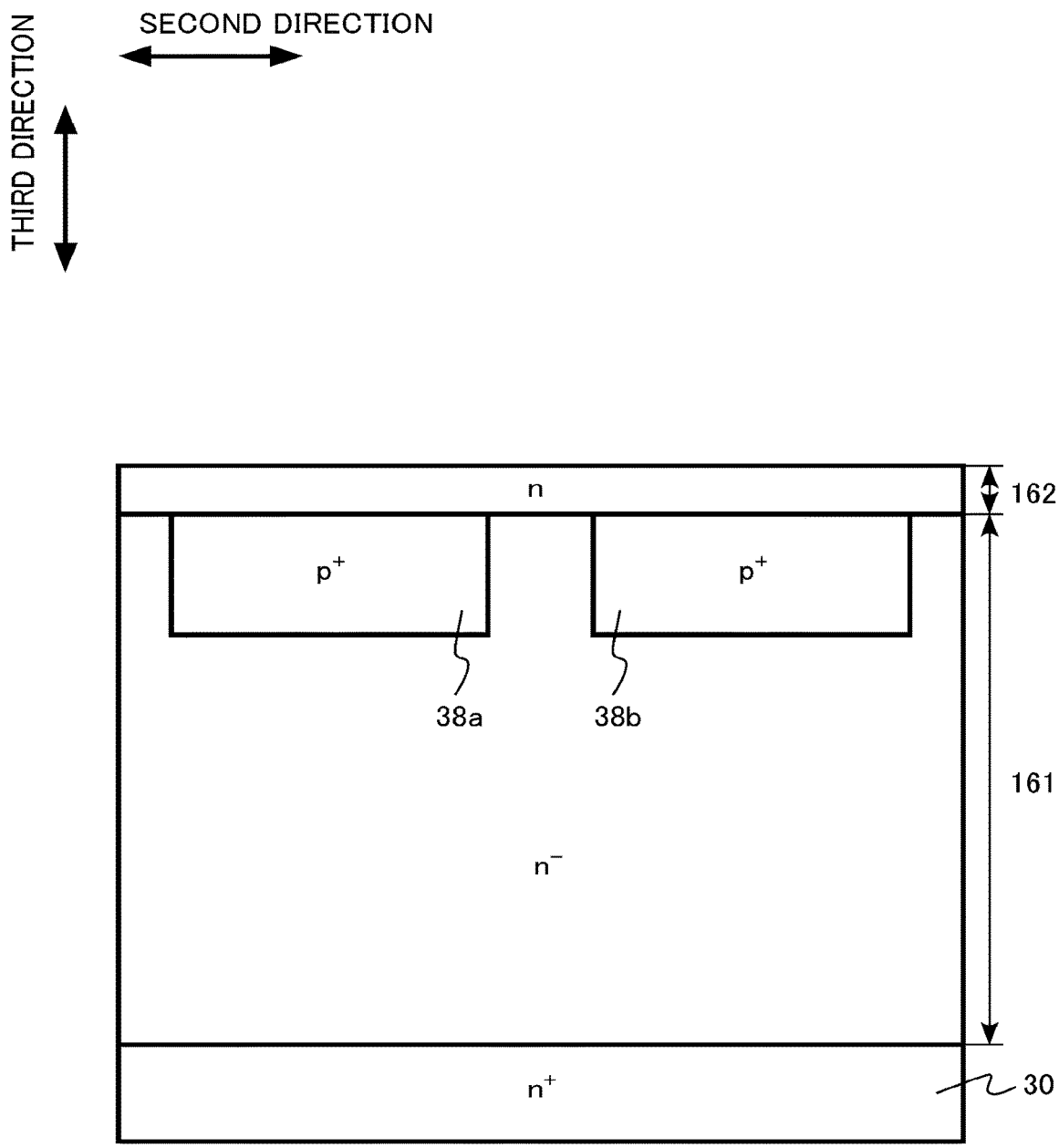
FIG. 7 is a schematic cross-sectional view showing an example of the method of manufacturing the semiconductor device of the first embodiment.

Next, an n-type second epitaxial layer 162 is formed on the front surface of the first epitaxial layer 161 (FIG. 7). The second epitaxial layer 162 is a silicon carbide layer formed on the first epitaxial layer 161 by an epitaxial growth method. A part of the second epitaxial layer 162 finally becomes a first current dispersion region 40a, a second current dispersion region 40b, a third current dispersion region 40c, a fourth current dispersion region 40d, a first connection region 42a, a second connection region 42b, a third connection region 42c, and a fourth connection region 42d.

Figure 8:
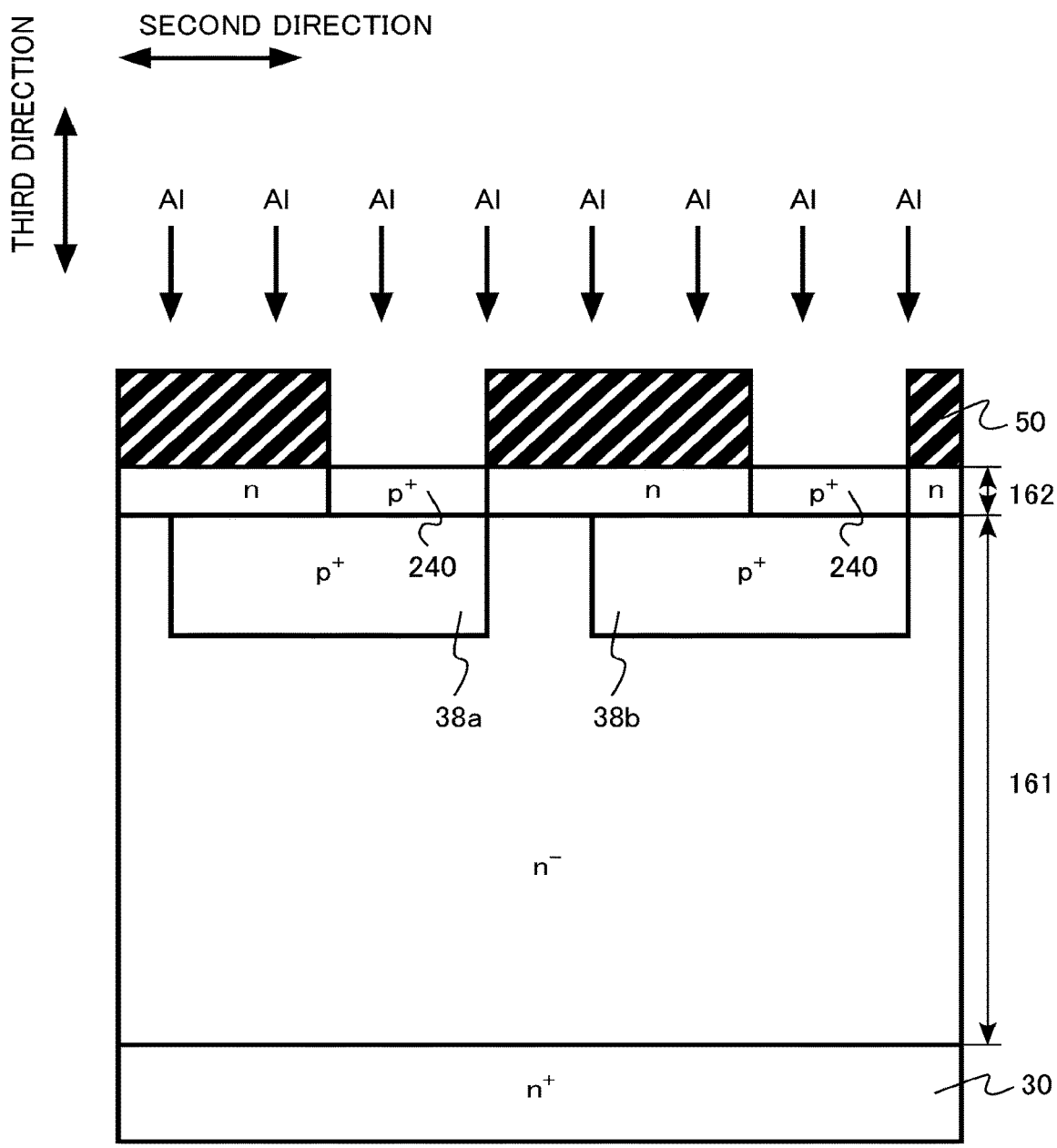
FIG. 8 is a schematic cross-sectional view showing an example of the method of manufacturing the semiconductor device of the first embodiment.

Next, a $p^+$-type region 240 is formed in the second epitaxial layer 162 by the ion implantation method (FIG. 8). For example, aluminum ions are implanted into the second epitaxial layer 162 using a mask material 50 as a mask. A part of the $p^+$-type region 240 finally becomes the first connection region 42a, the second connection region 42b, the third connection region 42c, and the fourth connection region 42d.

Figure 9:
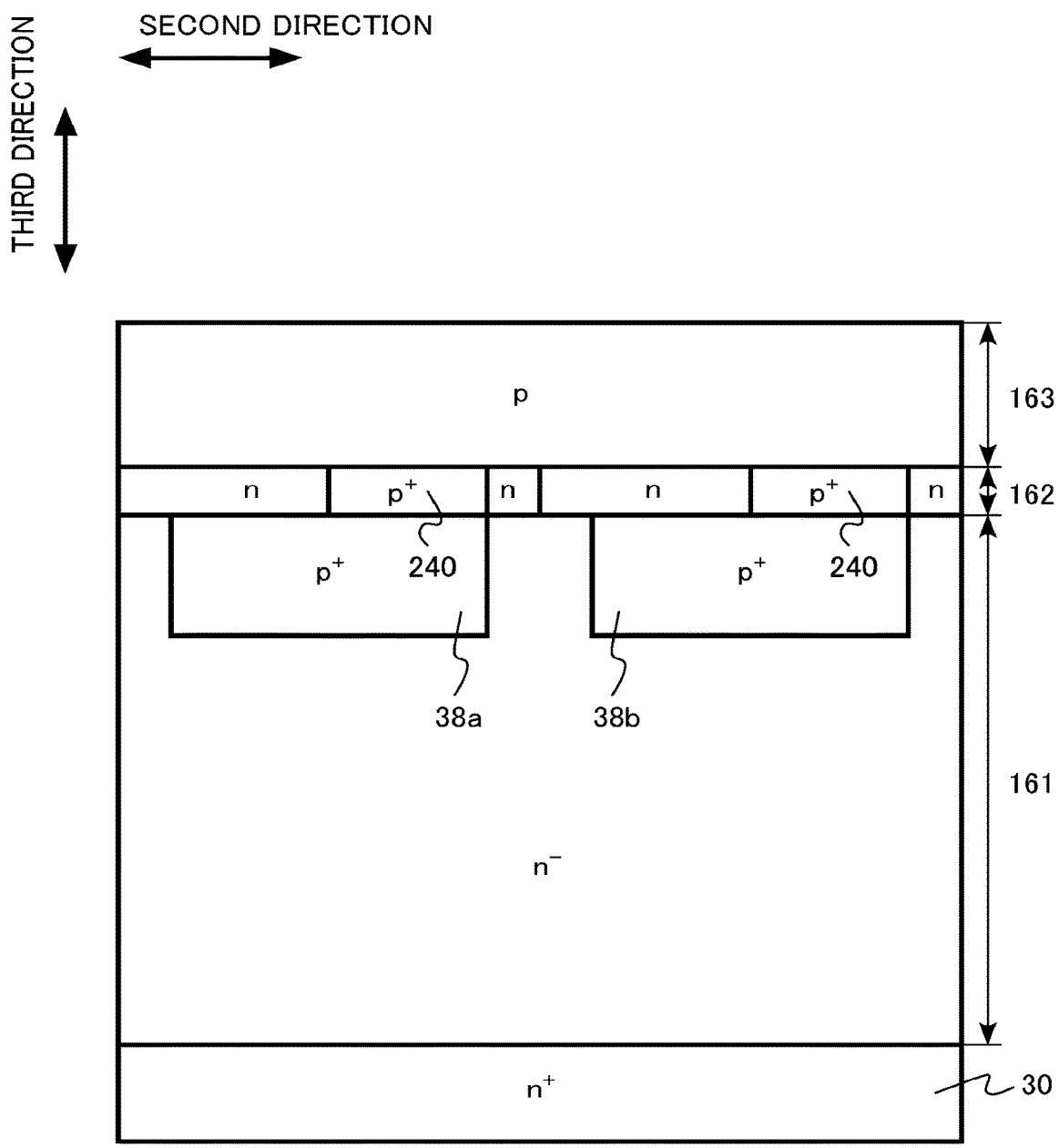
FIG. 9 is a schematic cross-sectional view showing an example of the method of manufacturing the semiconductor device of the first embodiment.

Next, a p-type third epitaxial layer 163 is formed on the front surface of the second epitaxial layer 162 (FIG. 9). The third epitaxial layer 163 is a silicon carbide layer formed on the second epitaxial layer 162 by the epitaxial growth method. A part of the third epitaxial layer 163 finally becomes a first body region 34a, a second body region 34b, and a third body region 34c.

Figure 10:
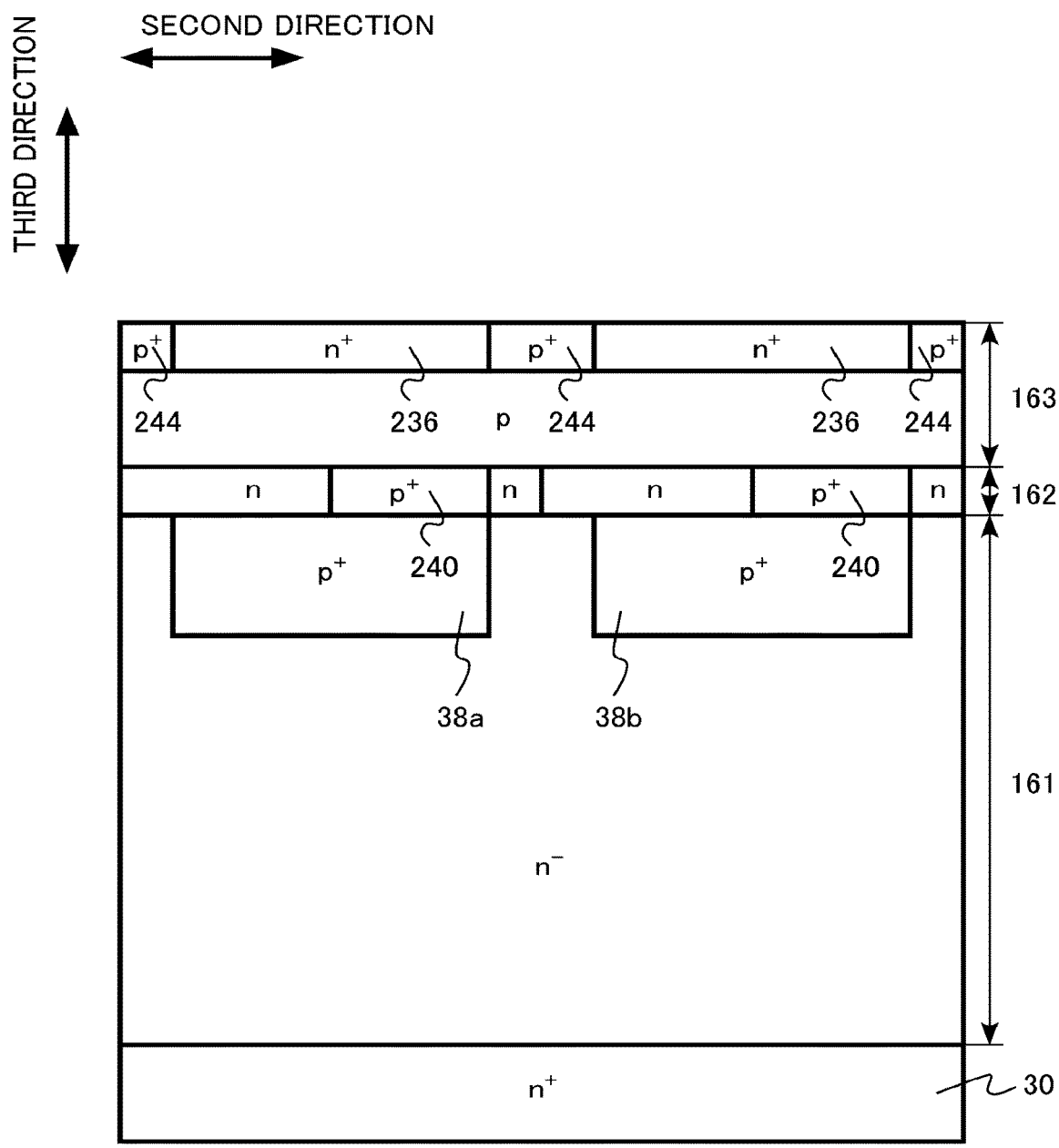
FIG. 10 is a schematic cross-sectional view showing an example of the method of manufacturing the semiconductor device of the first embodiment.

Next, an $n^+$-type region 236 and a $p^+$-type region 244 are formed in the third epitaxial layer 163 by the ion implantation method (FIG. 10). A part of the $n^+$-type region 236 finally becomes the first source region 36a, the second source region 36b, the third source region 36c, and the fourth source region 36d. A part of the $p^+$-type region 244 finally becomes the first contact region 44a, the second contact region 44b, and the third contact region 44c.

Figure 11:
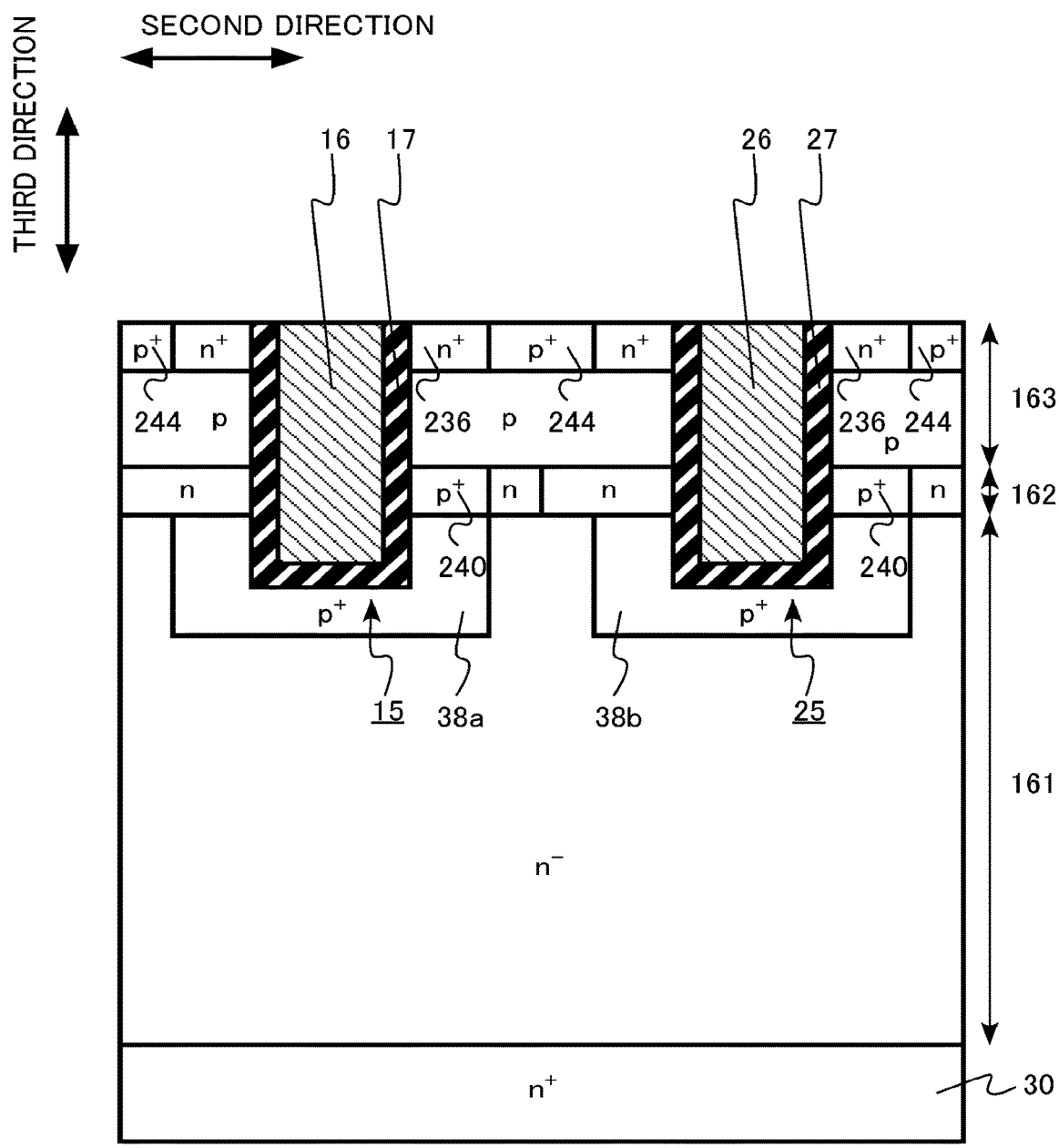
FIG. 11 is a schematic cross-sectional view showing an example of the method of manufacturing the semiconductor device of the first embodiment.

Next, the first trench 15 and the second trench 25 are formed using a known process technique. Next, the gate insulating layer 17 and the gate electrode 16 are formed in the first trench 15 by a known method. Further, a gate insulating layer 27 and a gate electrode 26 are formed in the second trench 25 (FIG. 11).

Subsequently, the interlayer insulating layer 28, the source electrode 12, and the drain electrode 14 are formed using a known process technique. By the above manufacturing method, the MOSFET 100 shown in FIG. 1 is manufactured.

Hereinafter, the function and effect of the semiconductor device of the first embodiment will be described.

When a short-circuit occurs in the load while the MOSFET using silicon carbide is turned on, a high voltage is applied between the drain and source of the MOSFET. When a high voltage is applied between the drain and source, breakdown of the MOSFET occurs. Breakdown of MOSFET is thought to be due to heat generation caused by large current flow.

In order to avoid breakdown of the MOSFET, it is required to lengthen the time from the short-circuit of the load to the breakdown of the MOSFET. In other words, it is required to improve the short-circuit withstand capability.

In the MOSFET 100 of the first embodiment, a plurality of $p^+$-type connection regions for fixing the $p^+$-type electric field relaxation region provided for suppressing the dielectric breakdown of the gate insulating layer to the source potential are provided. Local heat generation of the MOSFET 100 is suppressed by determining the disposition of the plurality of $p^+$-type connection regions to a specific disposition. Therefore, breakdown of the MOSFET 100 is suppressed, and the short-circuit withstand capability can be improved. Details will be described below.

FIGS. 12, 13, 14, 15 and 16 are explanatory diagrams of the function and effect of the semiconductor device of the first embodiment.

Figure 12:
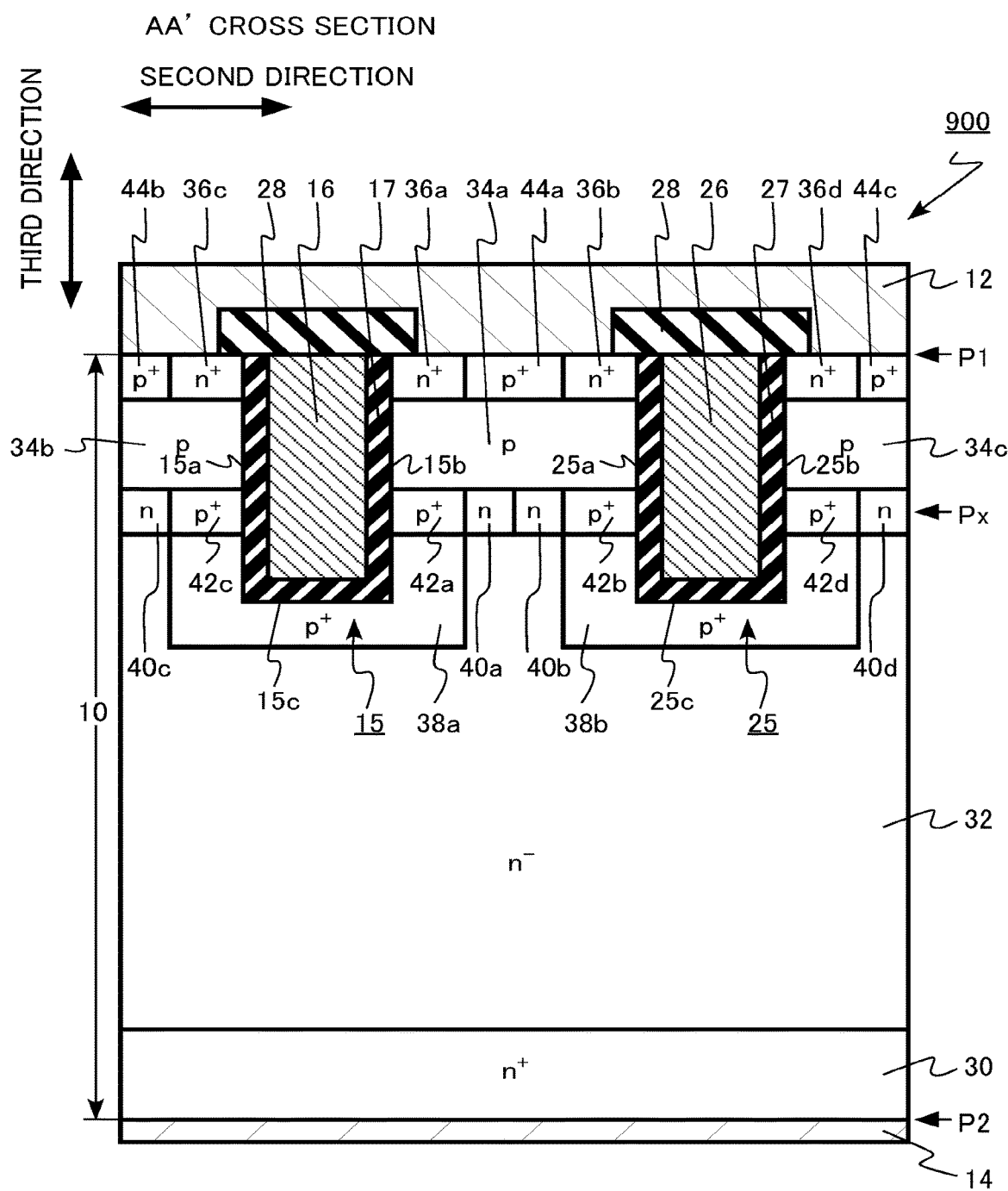
FIG. 12 is an explanatory diagram of the function and effect of the semiconductor device of the first embodiment.

FIG. 12 is a schematic cross-sectional view of a semiconductor device of a comparative example. The semiconductor device of the comparative example is a trench gate type vertical MOSFET 900 using silicon carbide. The MOSFET 900 is an n-channel type MOSFET using electrons as a carrier.

Figure 13:
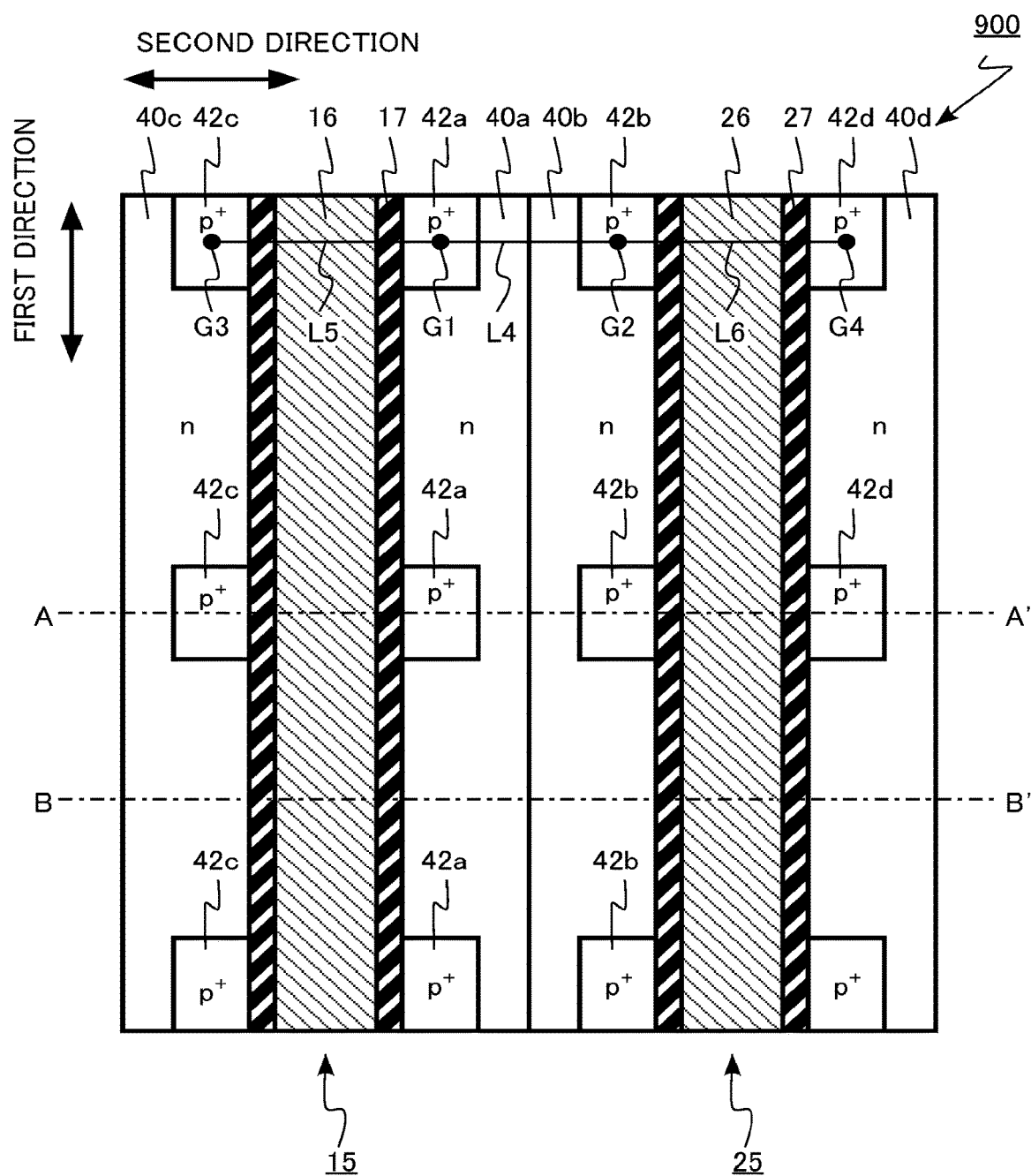
FIG. 13 is an explanatory diagram of the function and effect of the semiconductor device of the first embodiment.

FIG. 13 is a schematic cross-sectional view of a semiconductor device of a comparative example. FIG. 13 is a cross section taken along Px in FIG. 12. FIG. 13 is a cross section parallel to the first direction and the second direction. FIG. 13 is a cross section parallel to the first plane P1. FIG. 12 is a cross-section taken along line AA' of FIG. 13.

Figure 14:
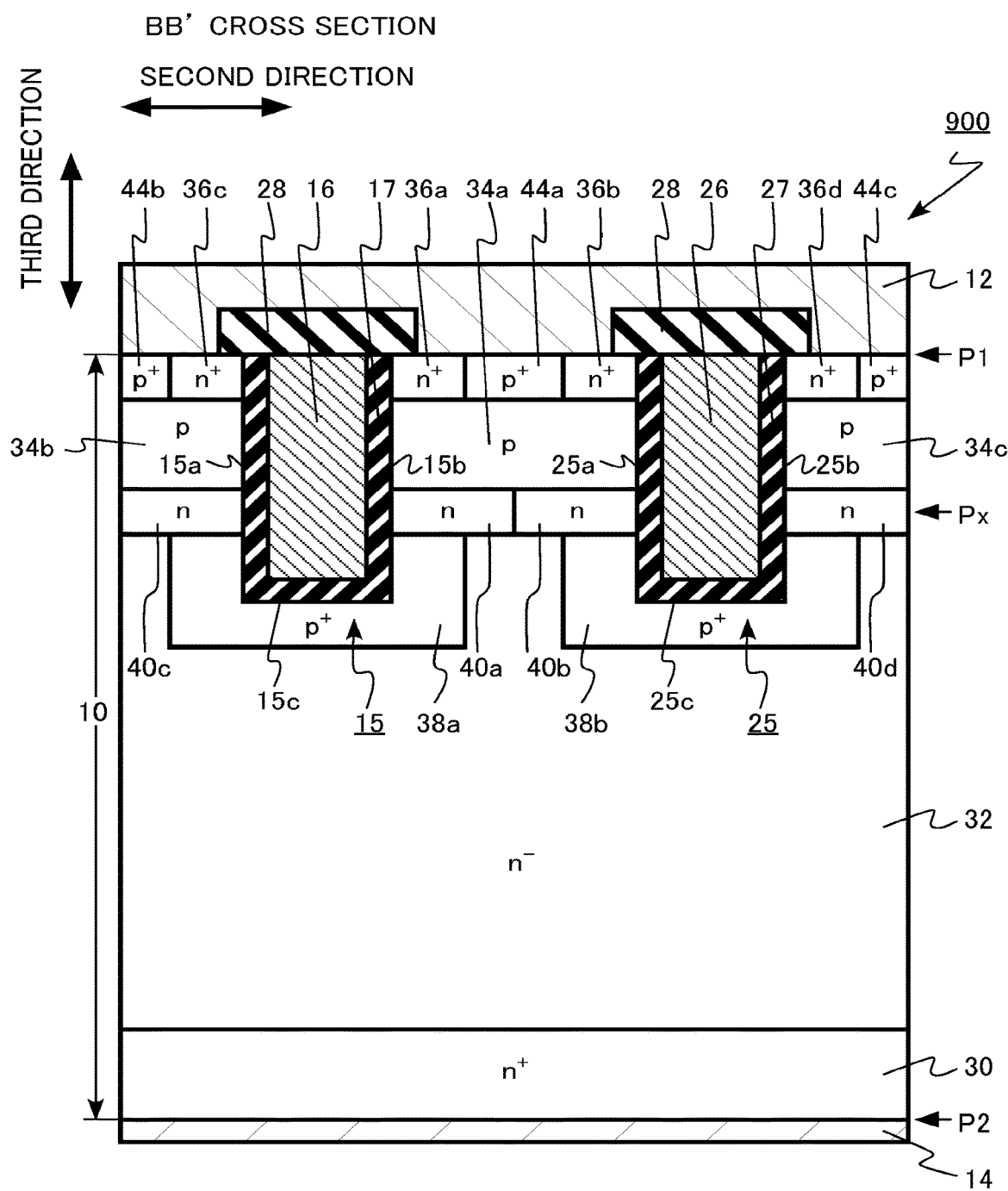
FIG. 14 is an explanatory diagram of the function and effect of the semiconductor device of the first embodiment.

FIG. 14 is a schematic cross-sectional view of a semiconductor device of a comparative example. FIG. 14 is a cross-section taken along line BB' of FIG. 13.

The MOSFET 900 of the comparative example is different from the MOSFET 100 of the first embodiment in the following point. The MOSFET 900 connects the first connection region 42a and the second connection region 42b, and a virtual line segment (L4 in FIG. 13) parallel to the first plane P1 is parallel to the second direction. A virtual line segment (L5 in FIG. 13) which connects the first connection region 42a and the third connection region 42c and is parallel to the first plane P1 is parallel to the second direction. A virtual line segment (L6 in FIG. 13) which connects the second connection region 42b and the fourth connection region 42d and is parallel to the first plane P1 is parallel to the second direction.

In the MOSFET 900 of the comparative example, the disposition pitch in the first direction is aligned with respect to the first connection region 42a and the second connection region 42b. In the MOSFET 900 of the comparative example, the positions of the first connection region 42a and the second connection region 42b in the first direction are aligned.

Figure 15:
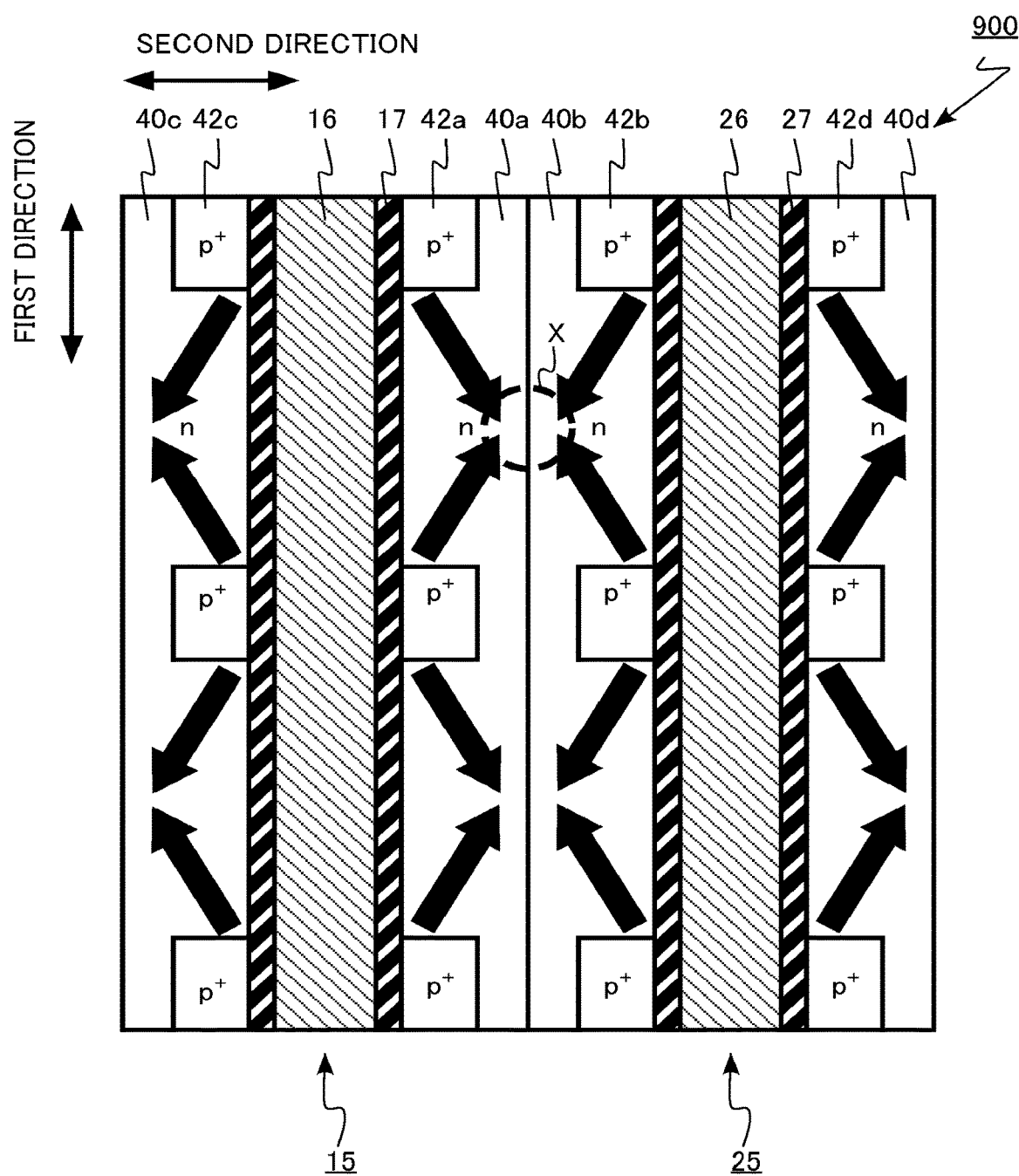
FIG. 15 is an explanatory diagram of the function and effect of the semiconductor device of the first embodiment.

FIG. 15 is a schematic diagram showing the current distribution flowing when the MOSFET 900 of the comparative example is turned on. FIG. 15 is a cross section corresponding to FIG. 13. The current distribution is indicated by an arrow.

On the lower side of the first connection region 42a, the second connection region 42b, the third connection region 42c, and the fourth connection region 42d, that is, on the second plane P2 side, the first electric field relaxation region 38a or the second electric field relaxation region 38b exists. Therefore, a current flowing through the channel formation region on the upper side of the first connection region 42a, the second connection region 42b, the third connection region 42c, and the fourth connection region 42d, that is, on the first plane P1 side, cannot flow directly to the drift region 32 just below along the side plane of the trench. Therefore, the current flowing through the channel formation region on the upper side of the first connection region 42a, the second connection region 42b, the third connection region 42c, and the fourth connection region 42d flows through the first current dispersion region 40a, the second current dispersion region 40b, the third current dispersion region 40c, or the fourth current dispersion region 40d adjacent to the first connection region 42a, the second connection region 42b, the third connection region 42c, and the fourth connection region 42d, and then flows to the drift region 32.

As shown in FIG. 15, the current flowing through the channel formation region on the upper side of the first connection region 42a, the second connection region 42b, the third connection region 42c, and the fourth connection region is concentrated in a region X. Therefore, when the load is short-circuited, local heat generation due to current concentration in the region X becomes large. Therefore, breakdown due to heat generation of the MOSFET 900 is liable to occur, and the short-circuit withstand capability becomes small.

The current flowing through the channel formation region on the first plane P1 side is concentrated in the region X because the positions of the first connection region 42a and the second connection region 42b in the first direction are aligned.

Figure 16:
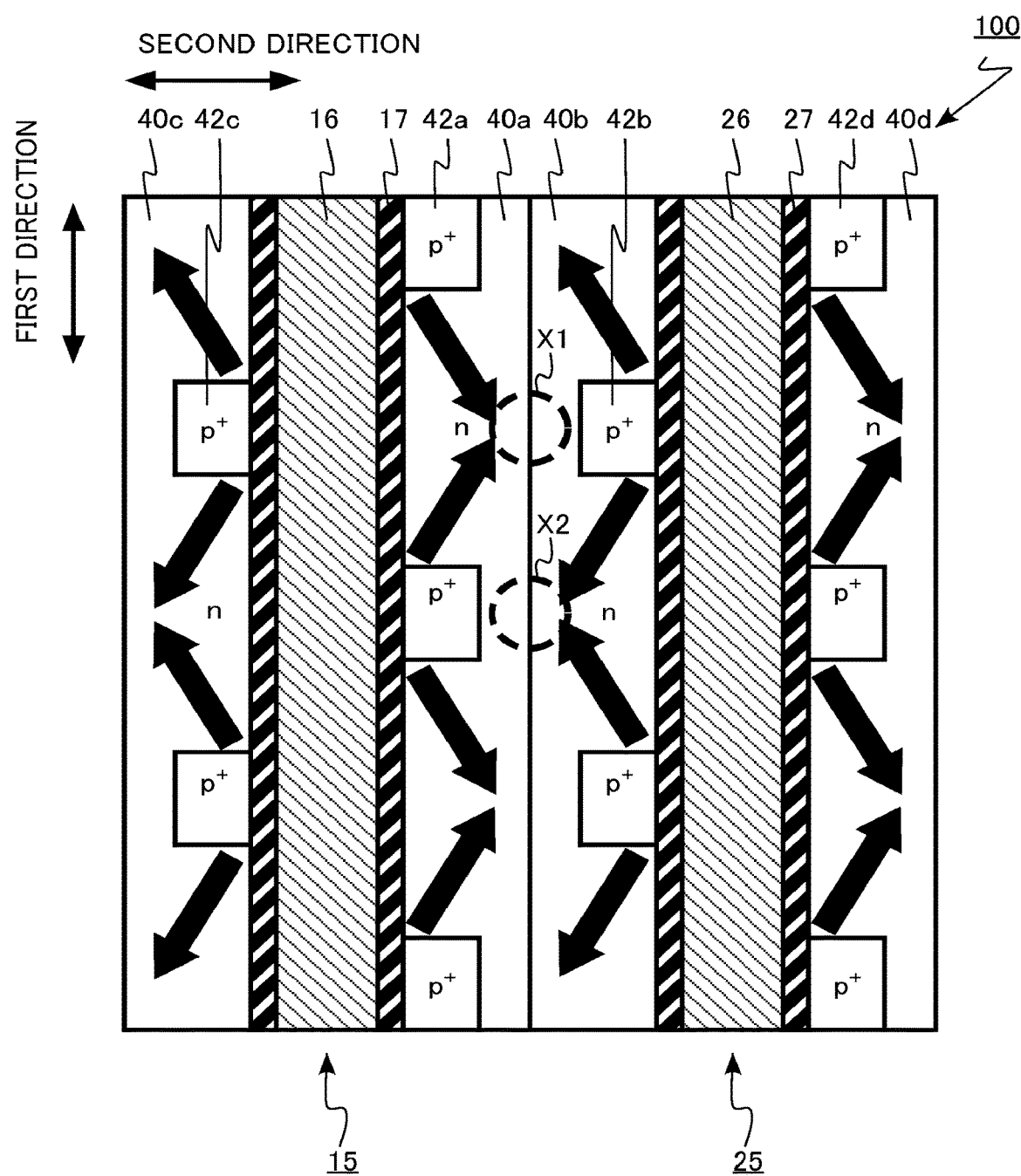
FIG. 16 is an explanatory diagram of the function and effect of the semiconductor device of the first embodiment.

FIG. 16 is a schematic diagram showing a current distribution flowing when the MOSFET 100 of the first embodiment is turned on. FIG. 16 is a cross section corresponding to FIG. 3. The current distribution is indicated by an arrow.

As shown in FIG. 16, the current flowing through the channel formation region on the upper side of the first connection region 42a, the second connection region 42b, the third connection region 42c, and the fourth connection region 42d, that is, on the first plane P1 side is dispersed into a region X1 and a region X2. In other words, the region in which the current concentrates is distributed. Therefore, local heat generation due to current concentration when the load is short-circuited is suppressed. Therefore, breakdown due to heat generation of the MOSFET 100 is suppressed, and the short-circuit withstand capability is increased.

Improvement in short-circuit withstand capability by the MOSFET 100 of the first embodiment is particularly conspicuous, for example, when the pitch of disposition of the trenches is small and the current density is large. From this point of view, the width in the second direction (w1 in FIG. 1) of the first connection region 42a is preferably one-fourth or more of the interval (d in FIG. 1) between the first trench 15 and the second trench 25, more preferably one-third or more. Similarly, the width in the second direction (w2 in FIG. 4) of the second connection region 42b is preferably one-fourth or more of the interval (d in FIG. 4) between the first trench 15 and the second trench 25, more preferably one-third or more.

From the viewpoint of stabilizing the potentials of the first electric field relaxation region 38a and the second electric field relaxation region 38b, there is a limit in reducing the widths of the first connection region 42a and the second connection region 42b in the second direction. However, if the ratio of the widths of the first connection region 42a and the second connection region 42b in the second direction becomes large, the on-resistance increases, which is not preferable. Therefore, the width in the second direction (w1 in FIG. 1) of the first connection region 42a is preferably not more than half the interval (d in FIG. 1) between the first trench 15 and the second trench 25. Similarly, the width in the second direction (w2 in FIG. 4) of the second connection region 42b is preferably not more than half the interval (d in FIG. 4) between the first trench 15 and the second trench 25.

As described above, according to the MOSFET 100 of the first embodiment, heat generation due to current concentration when the load is short-circuited is suppressed. Therefore, a MOSFET capable of improving short-circuit withstand capability can be realized.

Second Embodiment

The semiconductor device of the second embodiment is different from that of the first embodiment in that the virtual line segment which connects the ninth silicon carbide region and the fourteenth silicon carbide region and is parallel to the first plane is parallel to the second direction, and the virtual line segment which connects the tenth silicon carbide region and the eighteenth silicon carbide region and is parallel to the first plane is parallel to the second direction. Hereinafter, a part of the description overlapping with the first embodiment will be omitted.

Figure 17:
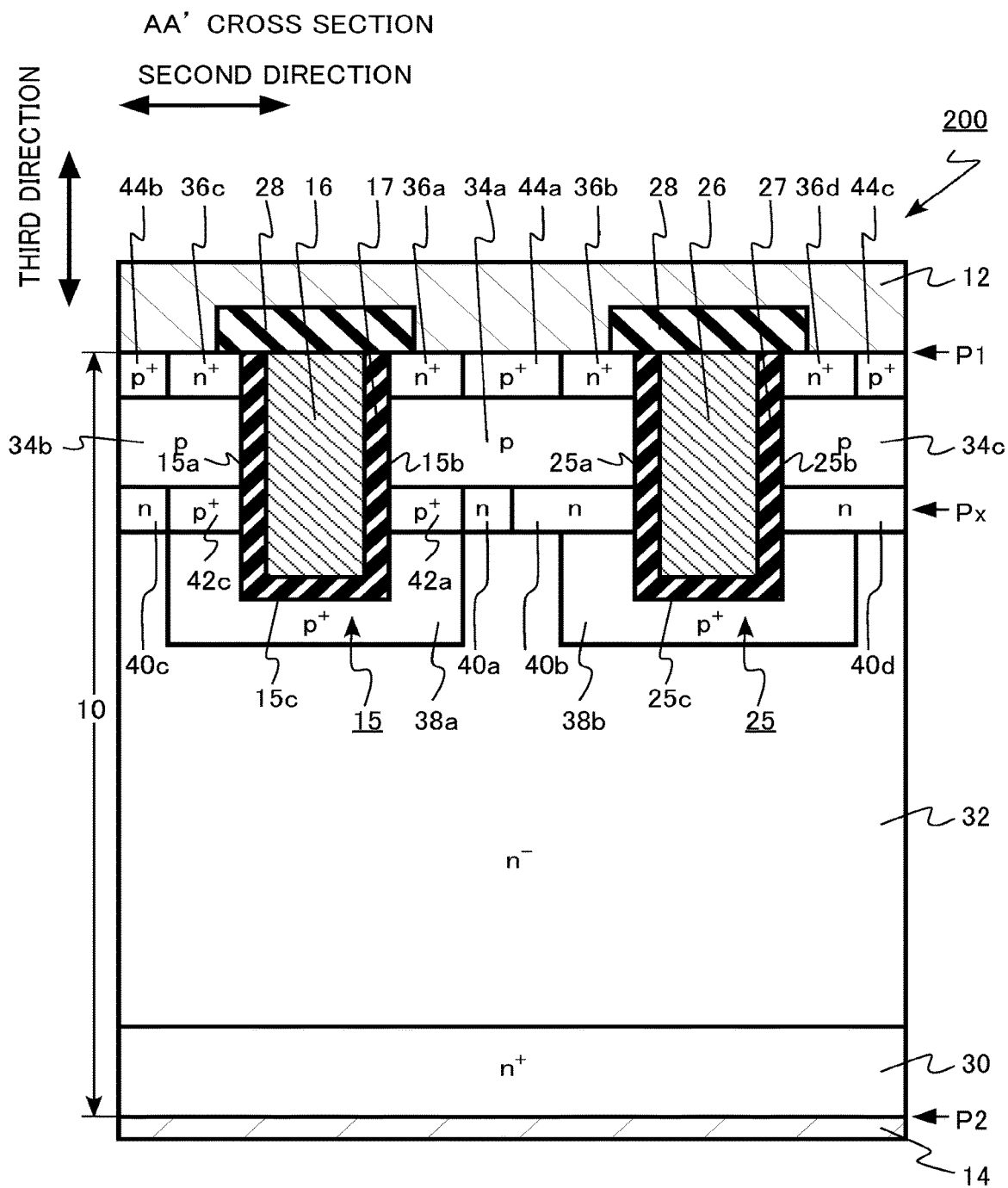
FIG. 17 is a schematic cross-sectional view of a semiconductor device of a second embodiment.

FIG. 17 is a schematic cross-sectional view of the semiconductor device of the second embodiment. The semiconductor device of the second embodiment is a trench gate type vertical MOSFET 200 using silicon carbide. The MOSFET 200 is an n-channel type MOSFET using electrons as a carrier.

Figure 18:
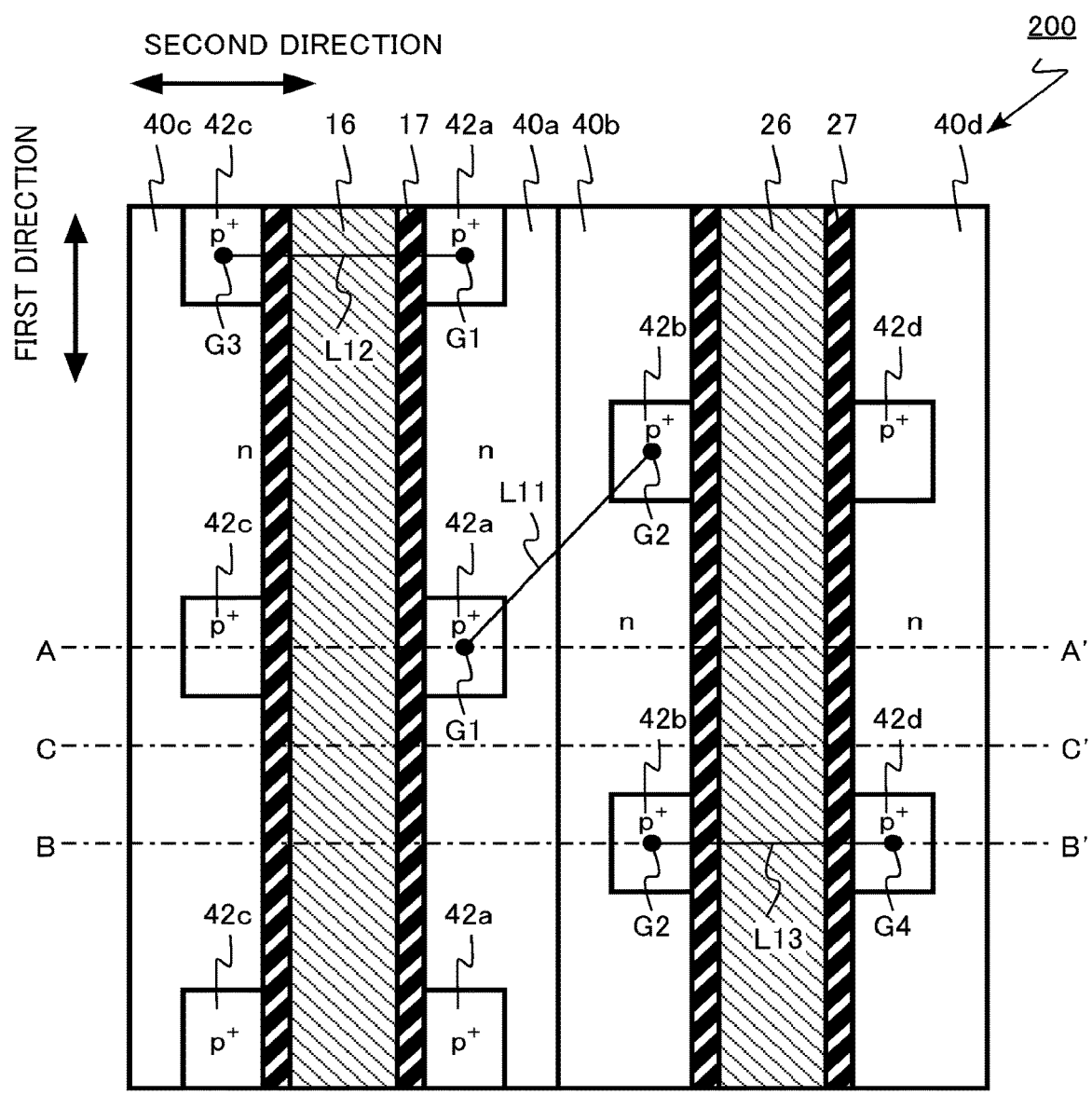
FIG. 18 is a schematic cross-sectional view of the semiconductor device of the second embodiment.

FIG. 18 is a schematic cross-sectional view of the semiconductor device of the second embodiment. FIG. 18 is a cross section taken along Px of FIG. 17. FIG. 18 is a cross section parallel to the first direction and the second direction. FIG. 18 is a cross section parallel to the first plane P1. FIG. 17 is a cross section taken along the line AA' in FIG. 18.

Figure 19:
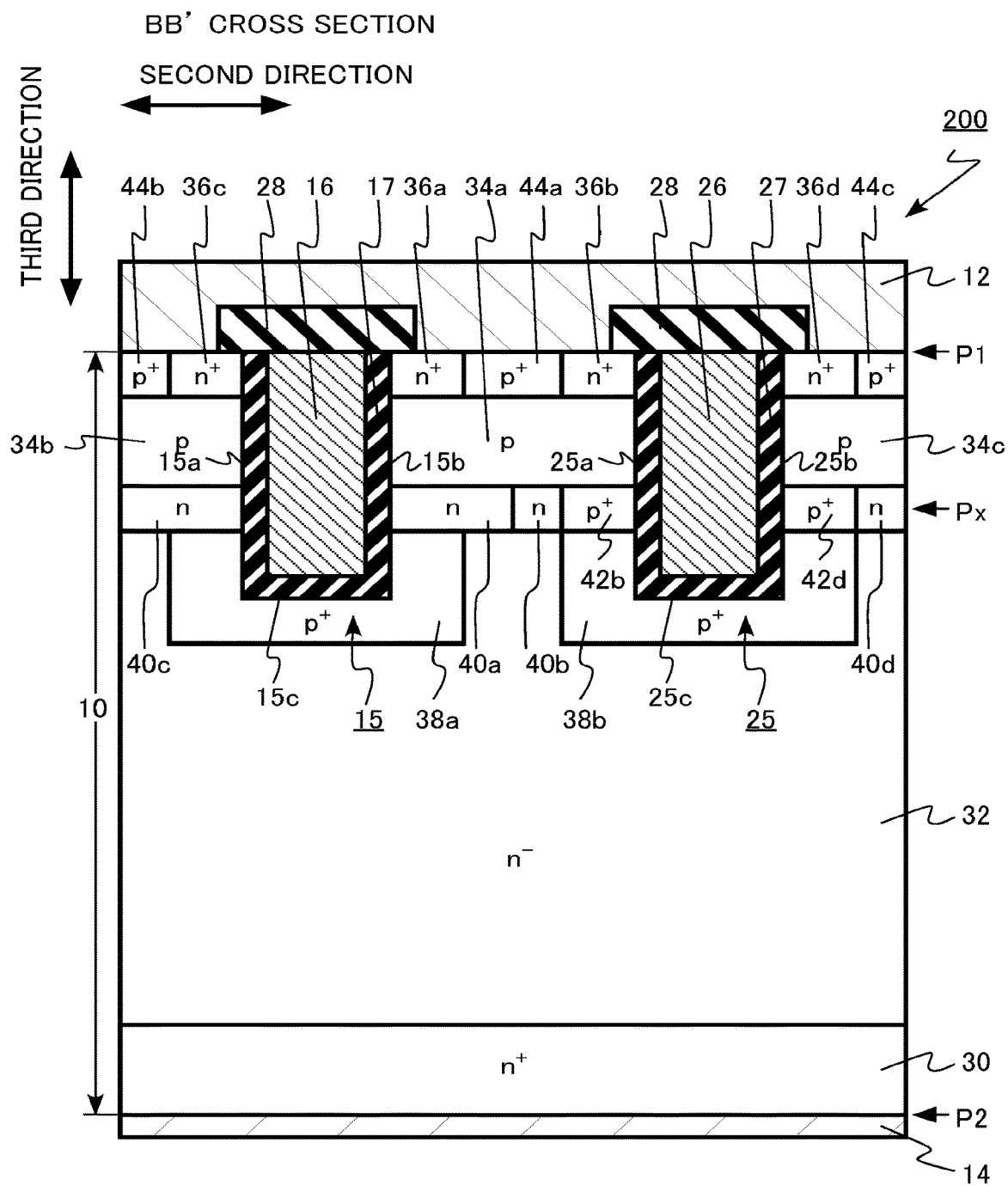
FIG. 19 is a schematic cross-sectional view of the semiconductor device of the second embodiment.
Figure 20:
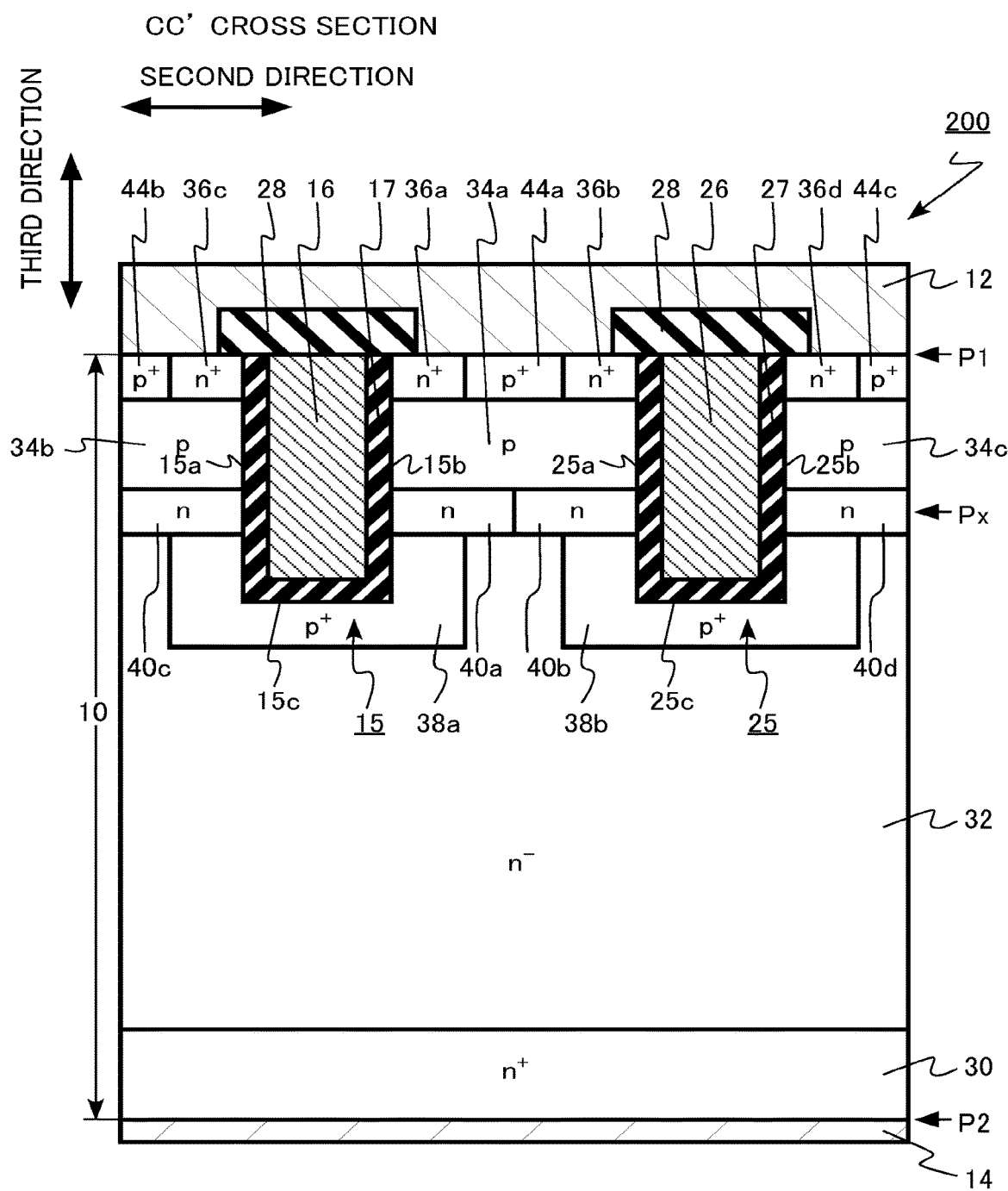
FIG. 20 is a schematic cross-sectional view of the semiconductor device of the second embodiment.

FIG. 19 is a schematic cross-sectional view of the semiconductor device of the second embodiment. FIG. 19 is a cross section taken along the line BB' in FIG. 18. FIG. 20 is a schematic cross-sectional view of the semiconductor device of the second embodiment. FIG. 20 is a cross section taken along the line CC' in FIG. 18.

In the MOSFET 200, a virtual line segment (L11 in FIG. 18) which connects a $p^+$-type first connection region 42a (a ninth silicon carbide region) and a $p^+$-type second connection region 42b (a tenth silicon carbide region) and is parallel to the first plane P1 is oblique with respect to the second direction. The virtual line segment L11 is, for example, a line segment which connects a geometric center of gravity (G1 in FIG. 18) of the first connection region 42a and a geometric center of gravity (G2 in FIG. 18) of the second connection region 42b in a cross section parallel to the first plane P1.

In the MOSFET 200, a virtual line segment (L12 in FIG. 18) which connects the p⁺-type first connection region 42a (a ninth silicon carbide region) and the p⁺-type third connection region 42c (a fourteenth silicon carbide region) and is parallel to the first plane P1 is parallel to the second direction. Further, a virtual line segment (L13 in FIG. 18) which connects the p⁺-type second connection region 42b (a tenth silicon carbide region) and the p⁺-type fourth connection region 42d (an eighteenth silicon carbide region) and is parallel to the first plane P1 is parallel to the second direction.

Figure 21:
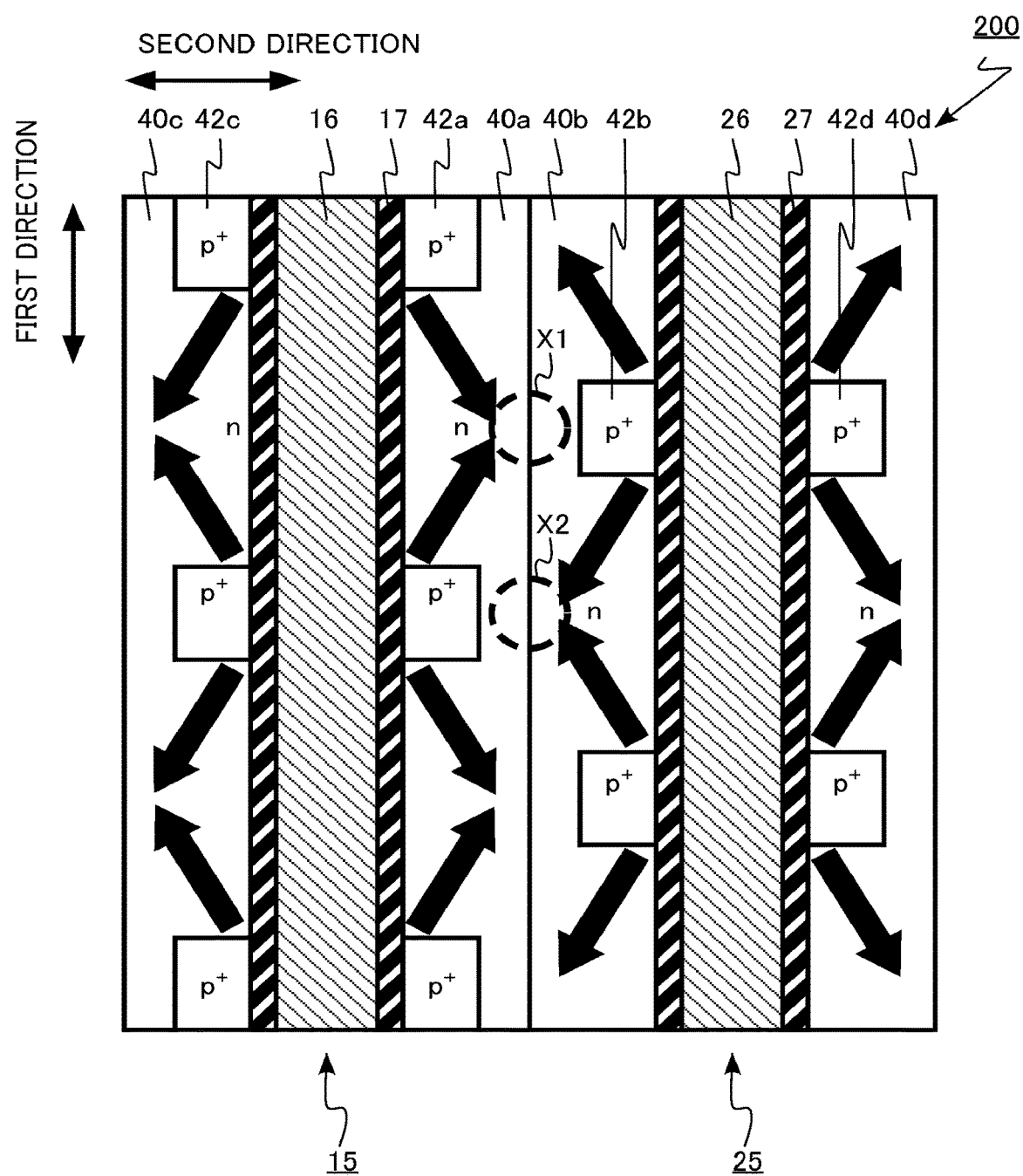
FIG. 21 is an explanatory diagram of the function and effect of the semiconductor device of the second embodiment.

FIG. 21 is an explanatory diagram of the function and effect of the semiconductor device of the second embodiment. FIG. 21 is a schematic diagram showing the current distribution flowing when the MOSFET 200 of the second embodiment is turned on. FIG. 21 is a cross section corresponding to FIG. 18. The current distribution is indicated by an arrow.

As shown in FIG. 21, as in the first embodiment, a current flowing through the channel formation region on the upper side of the first connection region 42a, the second connection region 42b, the third connection region 42c, and the fourth connection region 42d, that is, on the first plane P1 side is dispersed into the region X1 and the region X2. Therefore, local heat generation due to current concentration when the load is short-circuited is suppressed. Therefore, breakdown of the MOSFET 200 due to heat generation is suppressed, and the short-circuit withstand capability is increased.

As described above, according to the MOSFET 200 of the second embodiment, as in the first embodiment, heat generation due to current concentration when the load is short-circuited is suppressed. Therefore, a MOSFET capable of improving short-circuit withstand capability can be realized.

Third Embodiment

The semiconductor device of the third embodiment is different from that of the first embodiment in that the first silicon carbide region is interposed between the seventh silicon carbide region and the eighth silicon carbide region. Hereinafter, a part of the description overlapping with the first embodiment will be omitted.

Figure 22:
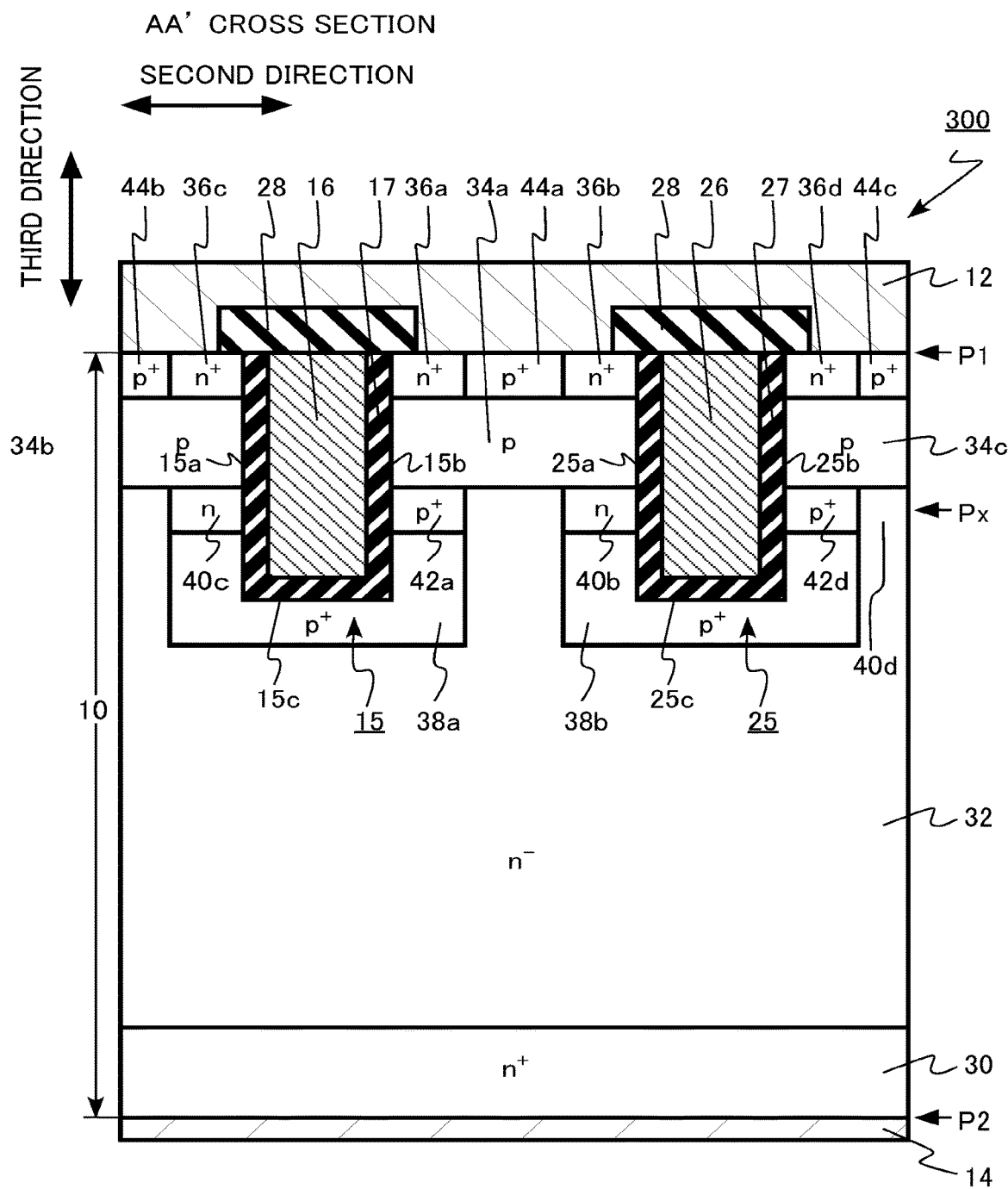
FIG. 22 is a schematic cross-sectional view of a semiconductor device of a third embodiment.

FIG. 22 is a schematic cross-sectional view of the semiconductor device of the third embodiment. The semiconductor device of the third embodiment is a trench gate type vertical MOSFET 300 using silicon carbide. The MOSFET 300 is an n-channel type MOSFET using electrons as a carrier.

Figure 23:
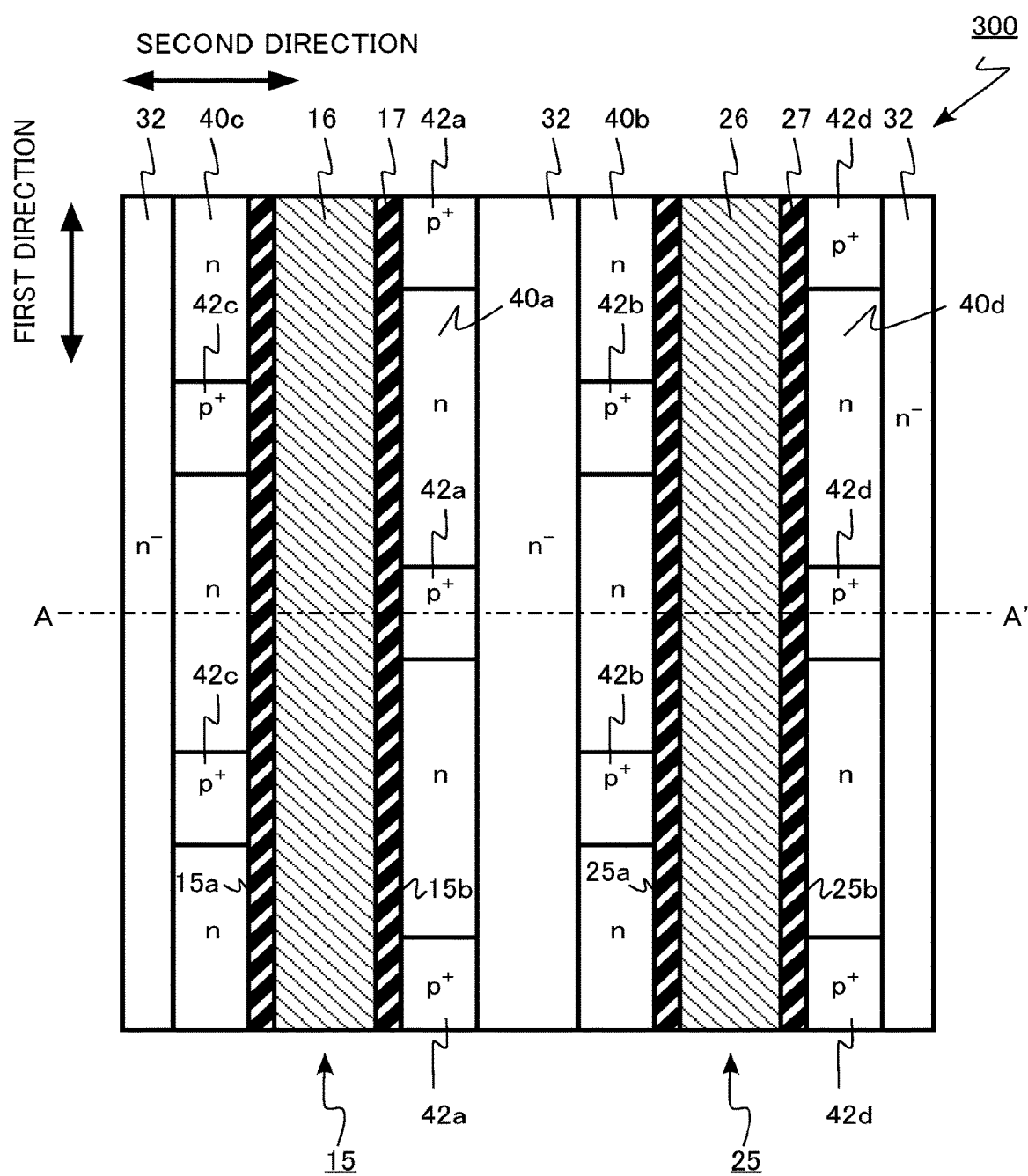
FIG. 23 is a schematic cross-sectional view of the semiconductor device of the third embodiment.

FIG. 23 is a schematic cross-sectional view of the semiconductor device of the third embodiment. FIG. 23 is a cross section taken along Px in FIG. 22. FIG. 23 is a cross section parallel to the first direction and the second direction. FIG. 23 is a cross section parallel to the first plane P1. FIG. 22 is a cross section taken along the line AA' in FIG. 23.

In the MOSFET 300, an n⁻-type drift region 32 (a first silicon carbide region) is interposed between the n-type first current dispersion region 40a (a seventh silicon carbide region) and the n-type second current dispersion region 40b (an eighth silicon carbide region).

According to the MOSFET 300 of the third embodiment, as in the first embodiment, heat generation due to current concentration when the load is short-circuited is suppressed. Therefore, a MOSFET capable of improving short-circuit withstand capability can be realized.

Fourth Embodiment

The semiconductor device of the fourth embodiment is different from that of the first embodiment in that the seventh silicon carbide region is interposed between the ninth silicon carbide region and the second side plane, and the eighth silicon carbide region is interposed between the tenth silicon carbide region and the third side plane. Hereinafter, a part of the description overlapping with the first embodiment will be omitted.

Figure 24:
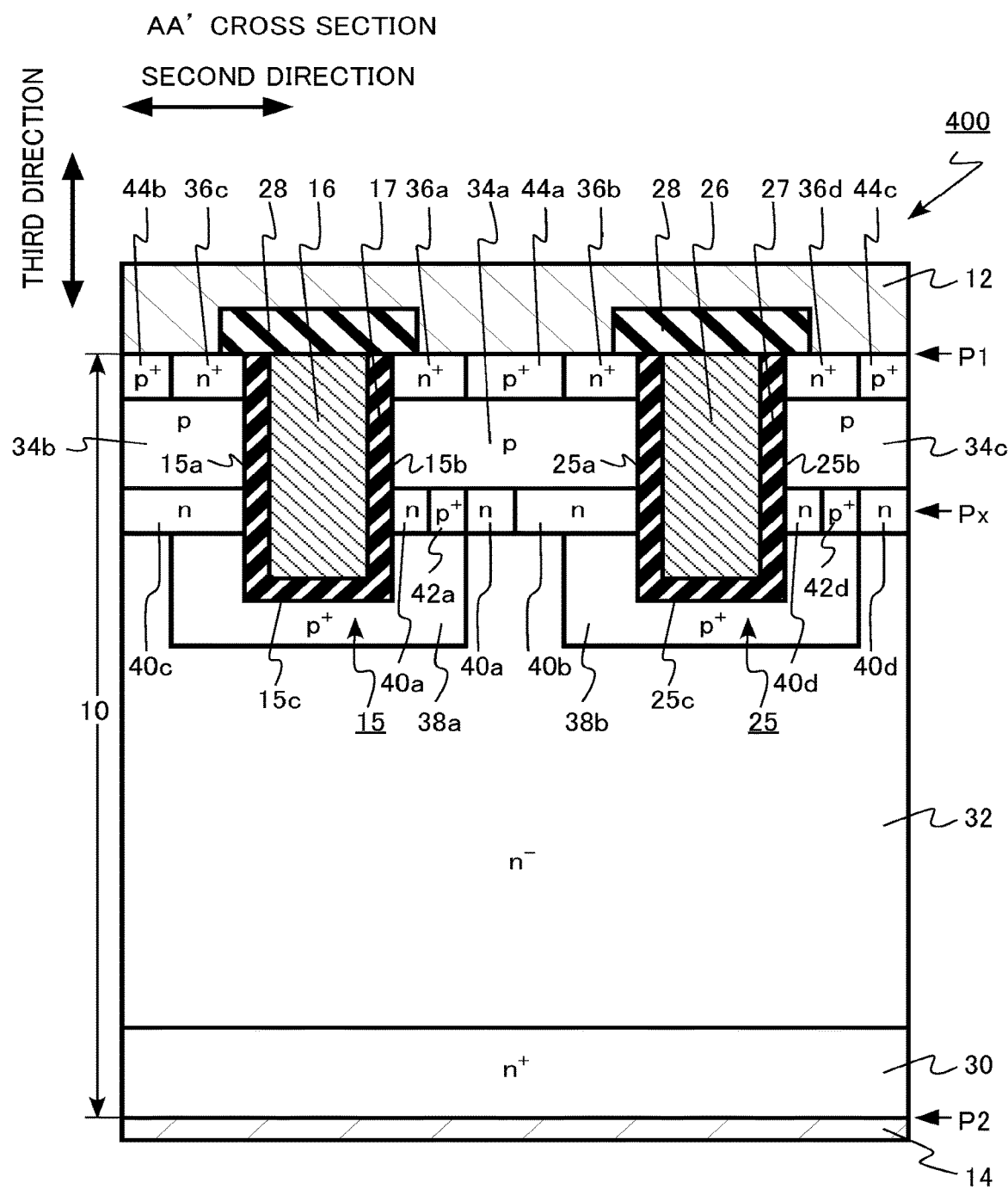
FIG. 24 is a schematic cross-sectional view of a semiconductor device of a fourth embodiment.

FIG. 24 is a schematic cross-sectional view of the semiconductor device of the fourth embodiment. The semiconductor device of the fourth embodiment is a trench gate type vertical MOSFET 400 using silicon carbide. The MOSFET 400 is an n-channel type MOSFET using electrons as a carrier.

Figure 25:
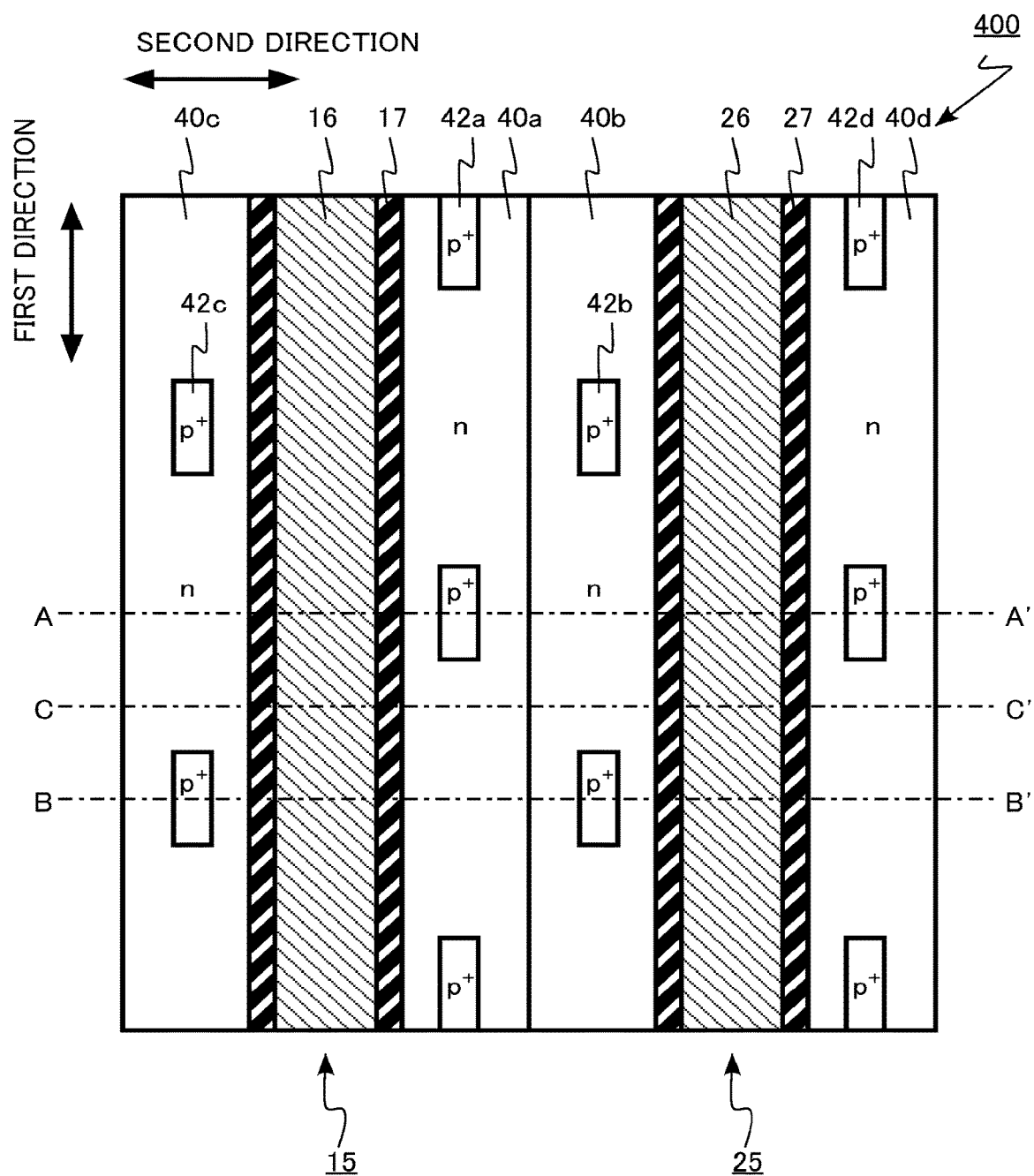
FIG. 25 is a schematic cross-sectional view of the semiconductor device of the fourth embodiment.

FIG. 25 is a schematic cross-sectional view of the semiconductor device of the fourth embodiment. FIG. 25 is a cross section taken along Px in FIG. 24. FIG. 25 is a cross section parallel to the first direction and the second direction. FIG. 25 is a cross section parallel to the first plane P1. FIG. 24 is a cross section taken along the line AA' in FIG. 25.

Figure 26:
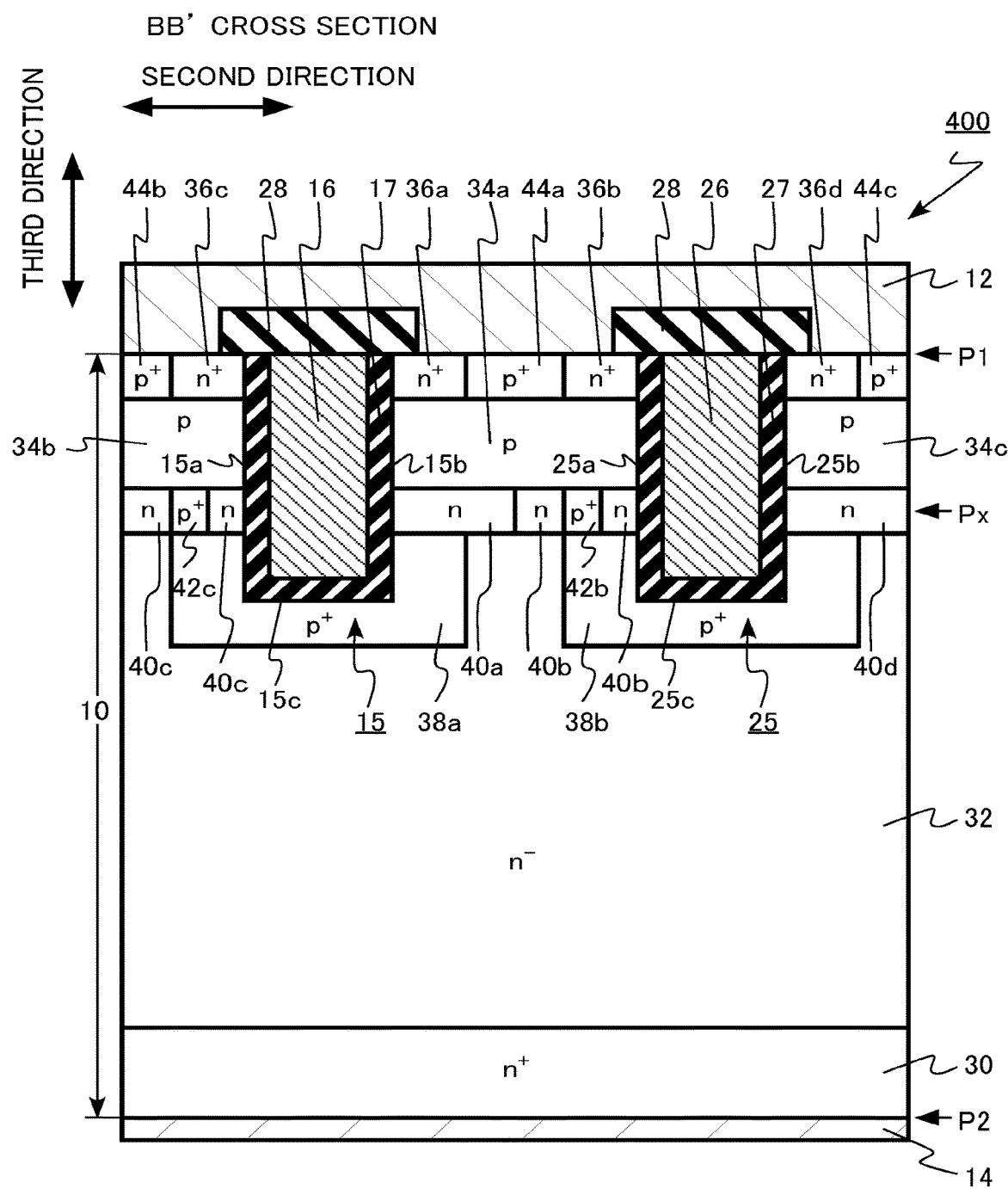
FIG. 26 is a schematic cross-sectional view of the semiconductor device of the fourth embodiment.
Figure 27:
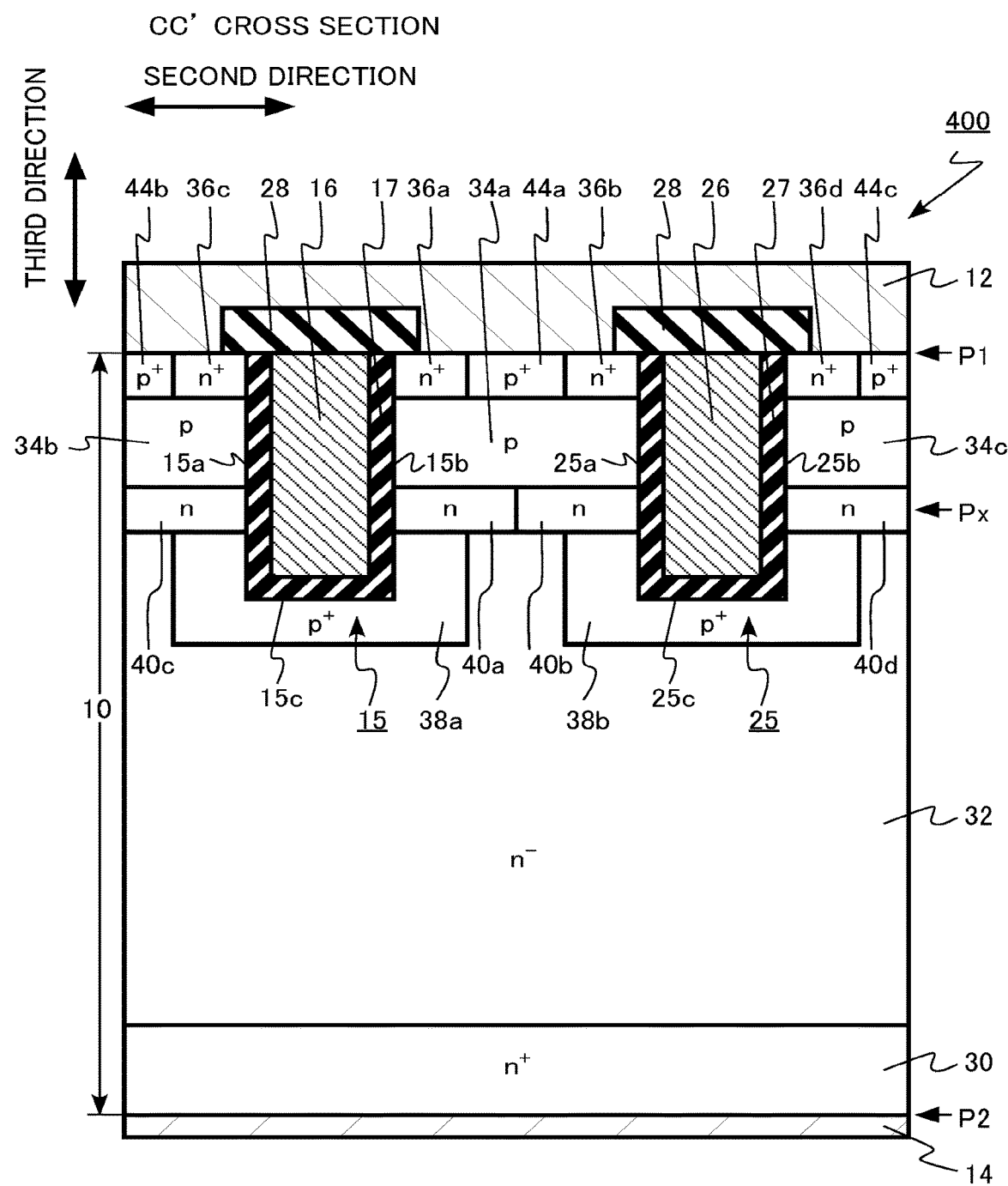
FIG. 27 is a schematic cross-sectional view of the semiconductor device of the fourth embodiment.

FIG. 26 is a schematic cross-sectional view of the semiconductor device of the fourth embodiment. FIG. 26 is a cross section taken along the line BB' in FIG. 25. FIG. 27 is a schematic cross-sectional view of the semiconductor device of the fourth embodiment. FIG. 27 is a cross section taken along the line CC' in FIG. 25.

In the MOSFET 400, an n-type first current dispersion region 40a (a seventh silicon carbide region) is interposed between the p⁺-type first connection region 42a (a ninth silicon carbide region) and the second side plane 15b of the first trench 15. In addition, an n-type second current dispersion region 40b (an eighth silicon carbide region) is interposed between the p⁺-type second connection region 42b (a tenth silicon carbide region) and the third side plane 25a of the second trench 25. In addition, an n-type third current dispersion region 40c (a thirteenth silicon carbide region) is interposed between the p⁺-type third connection region 42c (a fourteenth silicon carbide region) and the first side plane 15a of the first trench 15. In addition, an n-type fourth current dispersion region 40d (a seventeenth silicon carbide region) is interposed between the p⁺-type fourth connection region 42d (an eighteenth silicon carbide region) and the fourth side plane 25b of the second trench 25.

The first connection region 42a is separated from the second side plane 15b of the first trench 15. The second connection region 42b is separated from the third side plane 25a of the second trench 25. The third connection region 42c is separated from the first side plane 15a of the first trench 15. The fourth connection region 42d is separated from the fourth side plane 25b of the second trench 25.

In the MOSFET 400, according to the above configuration, for example, also in a portion where the first connection region 42a is provided, the first current dispersion region 40a is in contact with the second side plane 15b of the first trench 15. Also in a portion where the second connection region 42b is provided, the second current dispersion region 40b is in contact with the third side plane 25a of the second trench 25.

Therefore, the current flowing through the channel formation region on the upper side of the first connection region 42a and the second connection region 42b, that is, on the first plane P1 side, directly flows along the side plane of the trench and flows into the first current dispersion region 40*a* or the second current dispersion region 40*b* just below. Subsequently, it flows to the drift region 32. Therefore, as compared with the MOSFET 100 of the first embodiment, the current path has low resistance. Thus, the on-resistance is reduced as compared with the MOSFET 100 of the first embodiment.

The same function also occurs with respect to the current flowing through the channel formation region on the upper side of the third connection region 42*c* and the fourth connection region 42*d*.

As described above, according to the MOSFET 400 of the fourth embodiment, as in the first embodiment, heat generation due to current concentration when the load is short-circuited is suppressed. Therefore, a MOSFET capable of improving short-circuit withstand capability can be realized. Further, the on-resistance is reduced as compared with the first embodiment.

Fifth Embodiment

A semiconductor device of the fifth embodiment includes a silicon carbide layer having a first plane parallel to a first direction and a second direction and a second plane parallel to the first plane; a first trench being provided in the silicon carbide layer, extending in the first direction on the first plane, and having a first side plane, a second side plane, and a first bottom plane between the first side plane and the second side plane; a first gate electrode located in the first trench; a first gate insulating layer located between the first gate electrode and the silicon carbide layer; a second trench being provided in the silicon carbide layer, extending in the first direction on the first plane, and having a third side plane facing the second side plane, a fourth side plane, and a second bottom plane between the third side plane and the fourth side plane; a second gate electrode located in the second trench; a second gate insulating layer located between the second gate electrode and the silicon carbide layer; an n-type first silicon carbide region located in the silicon carbide layer; a p-type second silicon carbide region located in the silicon carbide layer, located between the first silicon carbide region and the first plane, and located between the first trench and the second trench; an n-type third silicon carbide region located in the silicon carbide layer and located between the second silicon carbide region and the first plane; an n-type fourth silicon carbide region being located in the silicon carbide layer and located between the second silicon carbide region and the first plane, and interposing the third silicon carbide region between the first trench and the fourth silicon carbide region; a p-type fifth silicon carbide region being located in the silicon carbide layer and located between the first silicon carbide region and the first trench, and covering the first bottom plane; a p-type sixth silicon carbide region being located in the silicon carbide layer and located between the first silicon carbide region and the second trench, covering the second bottom plane, and interposing the first silicon carbide region between the fifth silicon carbide region and the sixth silicon carbide region; an n-type seventh silicon carbide region located in the silicon carbide layer and located between the fifth silicon carbide region and the second silicon carbide region; an n-type eighth silicon carbide region located in the silicon carbide layer and located between the sixth silicon carbide region and the second silicon carbide region; a plurality of p-type ninth silicon carbide regions being located in the silicon carbide layer and located between the fifth silicon carbide region and the second silicon carbide region, being in contact with the fifth silicon carbide region and the second silicon carbide region, being located between the second side plane and the third side plane, and being repeatedly disposed in the first direction; and a plurality of p-type tenth silicon carbide regions being located in the silicon carbide layer and located between the sixth silicon carbide region and the second silicon carbide region, being in contact with the sixth silicon carbide region and the second silicon carbide region, and being repeatedly disposed in the first direction, wherein the seventh silicon carbide region is interposed between the ninth silicon carbide region and the second side plane, and the eighth silicon carbide region is interposed between the tenth silicon carbide region and the third side plane.

The semiconductor device of the fifth embodiment is different from that of the fourth embodiment in that a virtual line segment which connects the ninth silicon carbide region and the tenth silicon carbide region and is parallel to the first plane is parallel to the second direction. In addition, it is different from the semiconductor device of the comparative example in that the seventh silicon carbide region is interposed between the ninth silicon carbide region and the second side plane and the eighth silicon carbide region is interposed between the tenth silicon carbide region and the third side plane. Hereinafter, a part of the description overlapping with the fourth embodiment will be omitted.

Figure 28:
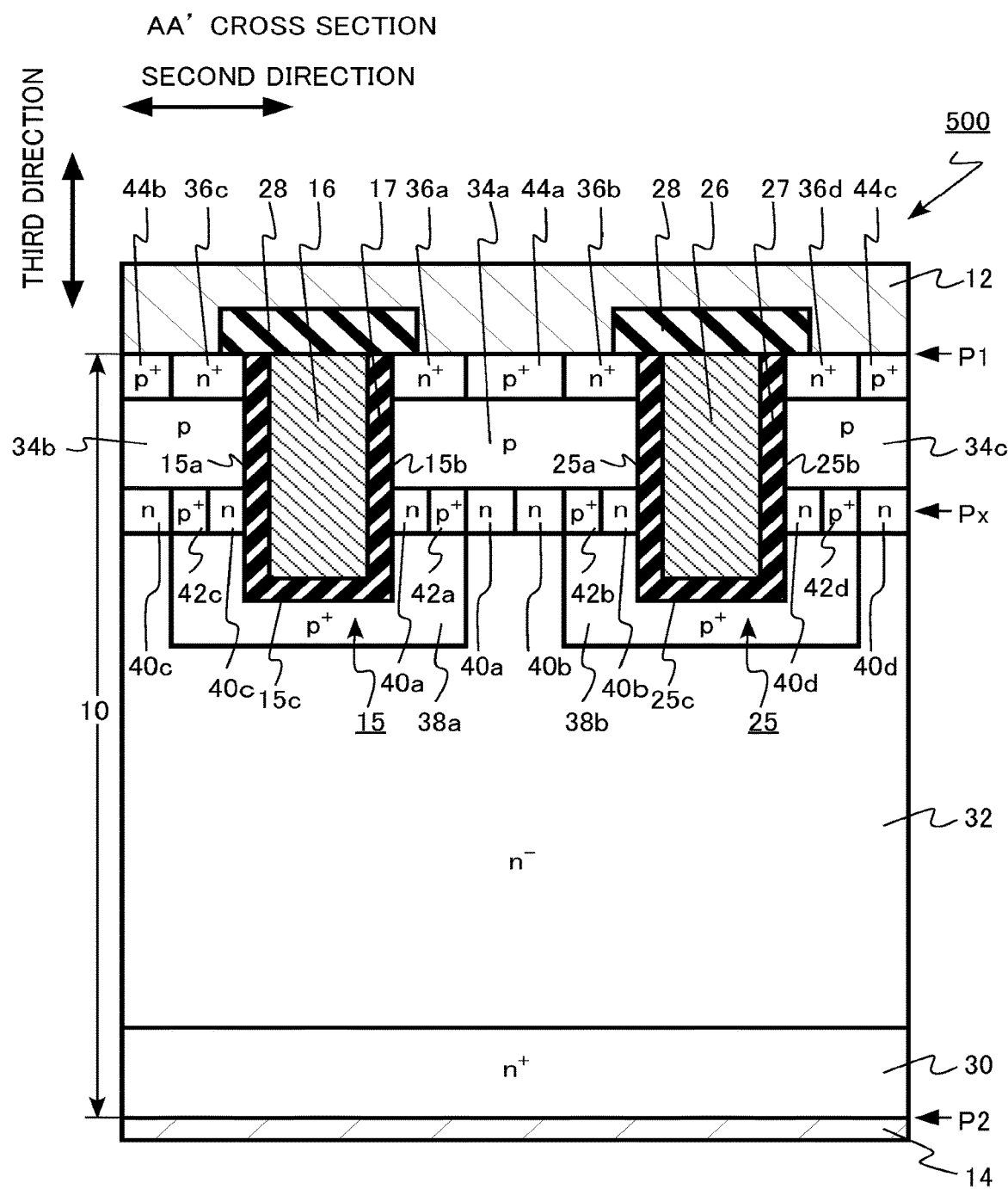
FIG. 28 is a schematic cross-sectional view of a semiconductor device of a fifth embodiment.

FIG. 28 is a schematic cross-sectional view of the semiconductor device of the fifth embodiment. The semiconductor device of the fifth embodiment is a trench gate type vertical MOSFET 500 using silicon carbide. The MOSFET 500 is an n-channel type MOSFET using electrons as a carrier.

Figure 29:
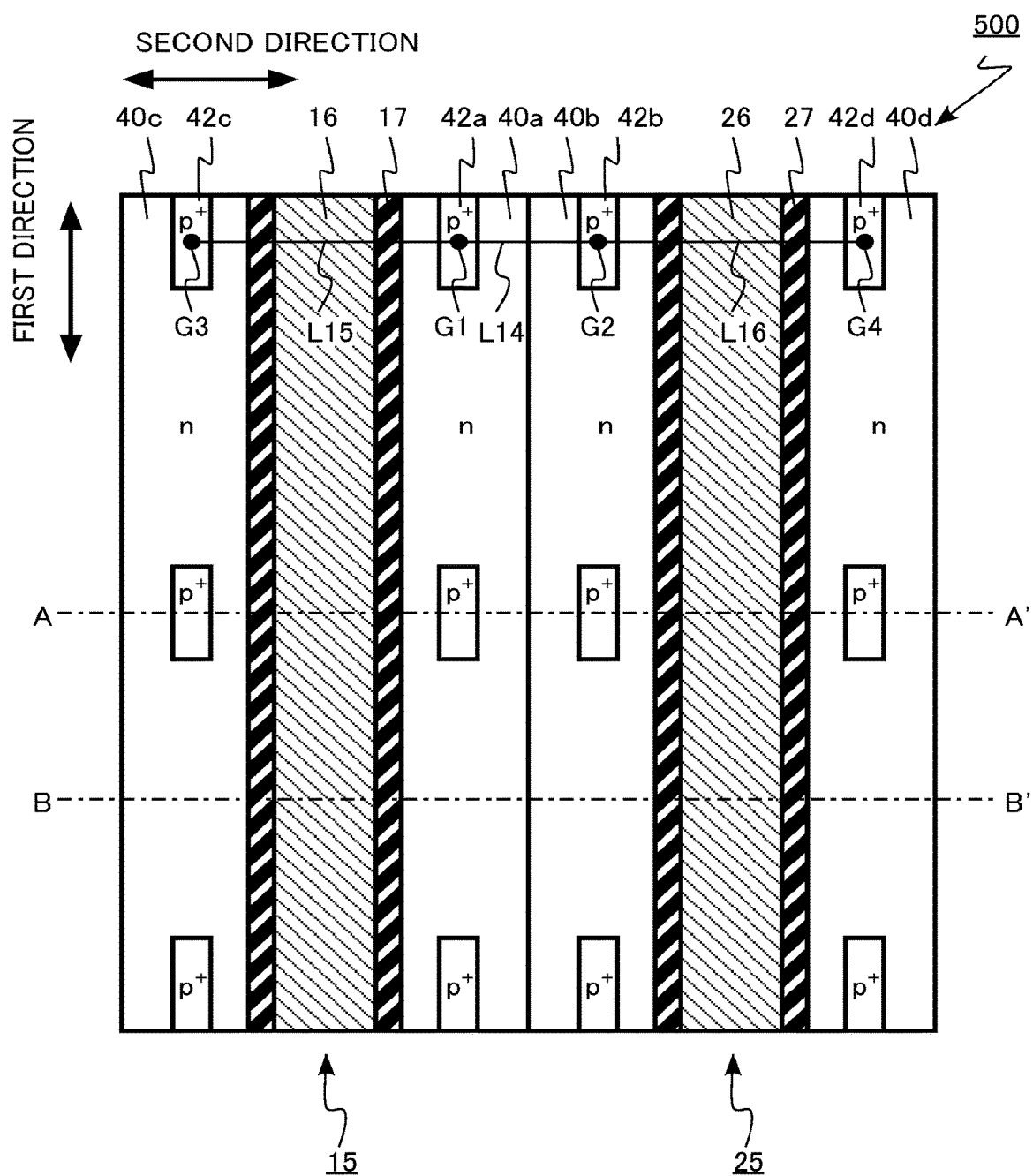
FIG. 29 is a schematic cross-sectional view of the semiconductor device of the fifth embodiment.

FIG. 29 is a schematic cross-sectional view of the semiconductor device of the fifth embodiment. FIG. 29 is a cross section taken along Px of FIG. 28. FIG. 29 is a cross section parallel to the first direction and the second direction. FIG. 29 is a cross section parallel to the first plane P1. FIG. 28 is a cross section taken along the line AA' in FIG. 29.

Figure 30:
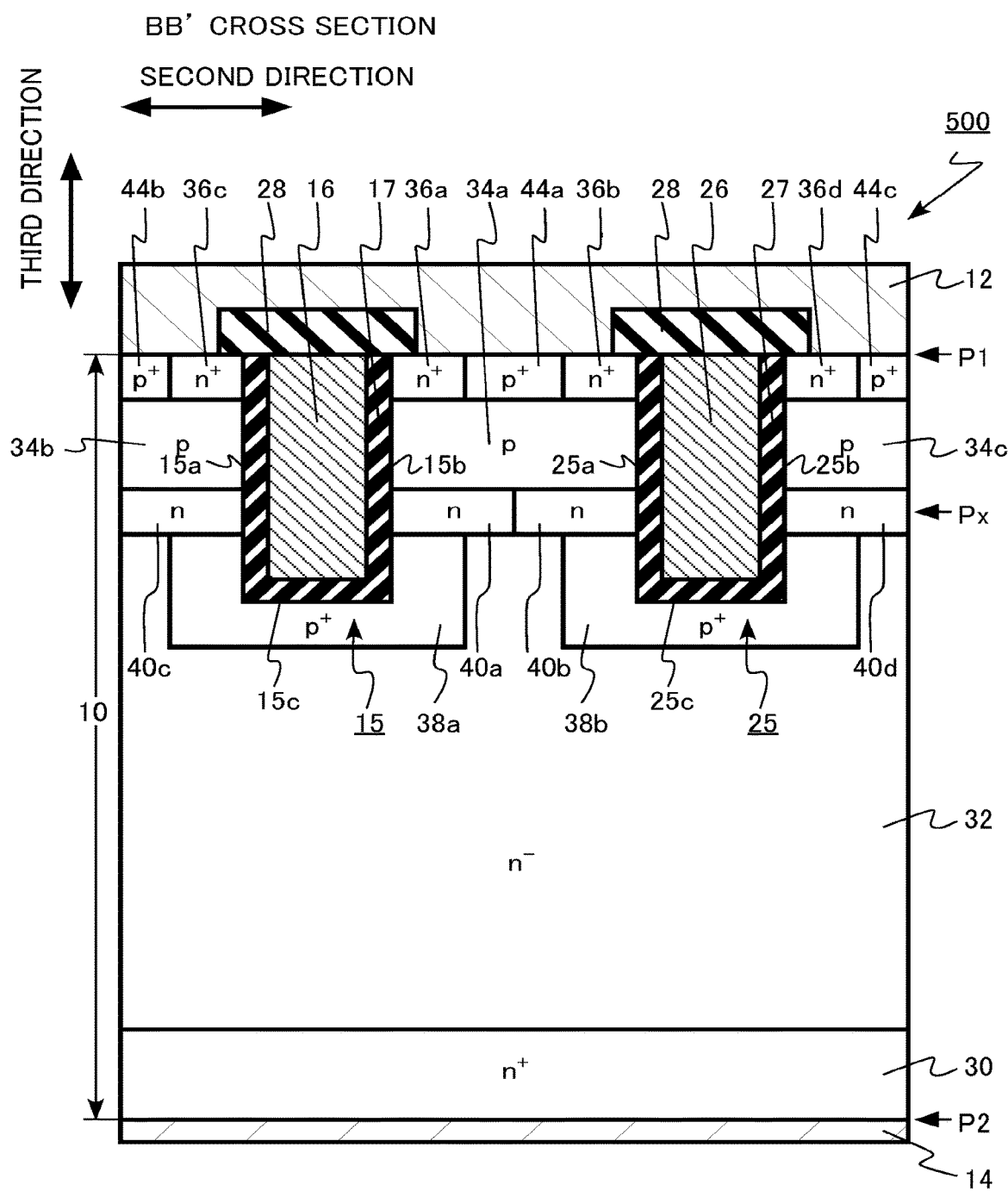
FIG. 30 is a schematic cross-sectional view of the semiconductor device of the fifth embodiment.

FIG. 30 is a schematic cross-sectional view of the semiconductor device of the fifth embodiment. FIG. 30 is a cross section taken along the line BB' in FIG. 29.

In the MOSFET 500, a virtual line segment (L14 in FIG. 29) which connects the first connection region 42*a* and the second connection region 42*b* and is parallel to the first plane P1 is parallel to the second direction. A virtual line segment (L15 in FIG. 29) which connects the first connection region 42*a* and the third connection region 42*c* and is parallel to the first plane P1 is parallel to the second direction. A virtual line segment (L16 in FIG. 29) which connects the second connection region 42*b* and the fourth connection region 42*d* and is parallel to the first plane P1 is parallel to the second direction.

In the MOSFET 500, an n-type first current dispersion region 40*a* (a seventh silicon carbide region) is interposed between the p$^+$-type first connection region 42*a* (a ninth silicon carbide region) and the second side plane 15*b* of the first trench 15. In addition, an n-type second current dispersion region 40*b* (an eighth silicon carbide region) is interposed between the p$^+$-type second connection region 42*b* (a tenth silicon carbide region) and the third side plane 25*a* of the second trench 25. In addition, an n-type third current dispersion region 40*c* (a thirteenth silicon carbide region) is interposed between the p$^+$-type third connection region 42*c* (a fourteenth silicon carbide region) and the first side plane 15*a* of the first trench 15. In addition, an n-type fourth current dispersion region 40*d* (a seventeenth silicon carbide region) is interposed between the p$^+$-type fourth connection region 42d (an eighteenth silicon carbide region) and the fourth side plane 25b of the second trench 25.

The first connection region 42a is separated from the second side plane 15b of the first trench 15. The second connection region 42b is separated from the third side plane 25a of the second trench 25. The third connection region 42c is separated from the first side plane 15a of the first trench 15. The fourth connection region 42d is separated from the fourth side plane 25b of the second trench 25.

In the MOSFET 500, according to the above configuration, for example, also in a portion where the first connection region 42a is provided, the first current dispersion region 40a is in contact with the second side plane 15b of the first trench 15. Also in a portion where the second connection region 42b is provided, the second current dispersion region 40b is in contact with the third side plane 25a of the second trench 25.

Therefore, the current flowing through the channel formation region on the upper side of the first connection region 42a and the second connection region 42b, that is, on the first plane P1 side, directly flows along the side plane of the trench and flows into the first current dispersion region 40a or the second current dispersion region 40b just below. Subsequently, it flows to the drift region 32. Therefore, as compared to the MOSFET 100 of the first embodiment and the MOSFET 900 of the comparative example, the current path has low resistance. Thus, the on-resistance is reduced as compared with the MOSFET 100 of the first embodiment and the MOSFET 900 of the comparative example.

The same function also occurs with respect to the current flowing through the channel formation region on the upper side of the third connection region 42c and the fourth connection region 42d.

As described above, according to the MOSFET 500 of the fifth embodiment, a MOSFET capable of reducing the on-resistance can be realized.

Sixth Embodiment

The inverter circuit and the driving device of the sixth embodiment are driving devices including the semiconductor device of the first embodiment.

Figure 31:
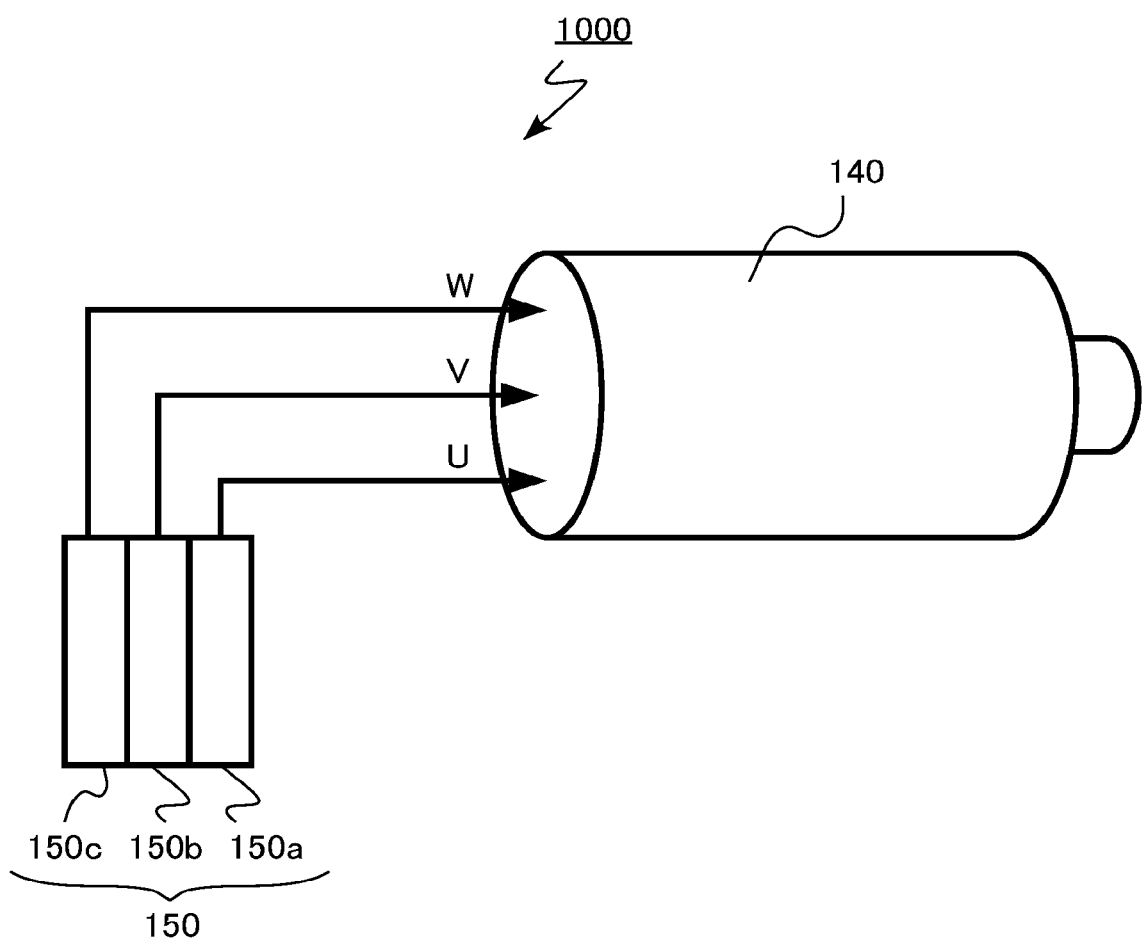
FIG. 31 is a schematic diagram of a driving device of a sixth embodiment.

FIG. 31 is a schematic diagram of the driving device of the sixth embodiment. A driving device 1000 includes a motor 140 and an inverter circuit 150.

The inverter circuit 150 is composed of three semiconductor modules 150a, 150b, 150c using the MOSFET 100 of the first embodiment as a switching element. The three semiconductor modules 150a, 150b, and 150c are connected in parallel to realize a three-phase inverter circuit 150 having three AC voltage output terminals U, V, W. The AC voltage output from the inverter circuit 150 drives the motor 140.

According to the sixth embodiment, since the MOSFET 100 with improved characteristics is provided, the characteristics of the inverter circuit 150 and the driving device 1000 are improved.

Seventh Embodiment

The vehicle of the seventh embodiment is a vehicle including the semiconductor device of the first embodiment.

Figure 32:
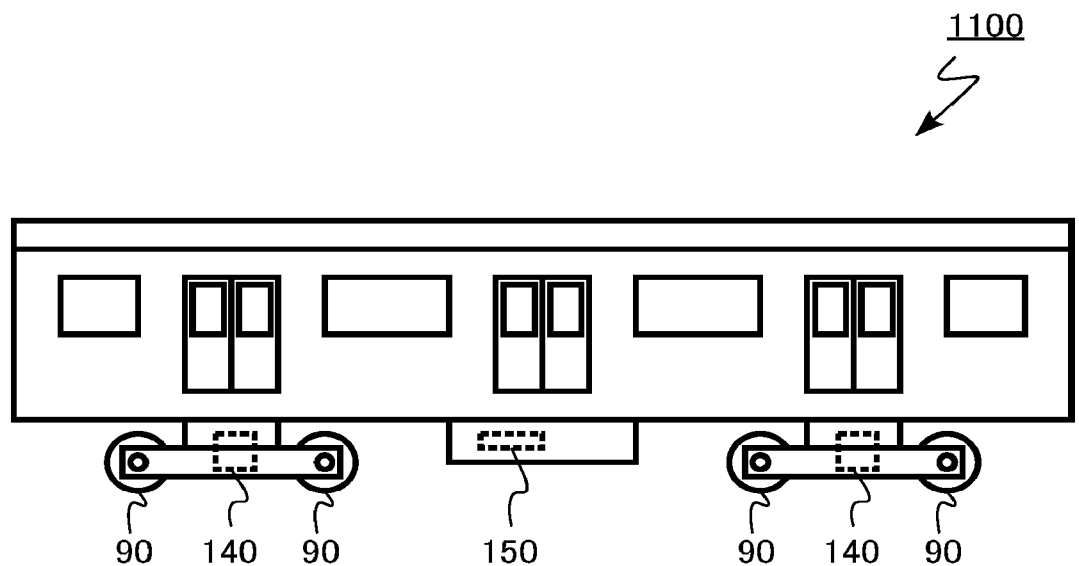
FIG. 32 is a schematic diagram of a vehicle of a seventh embodiment.

FIG. 32 is a schematic diagram of the vehicle of the seventh embodiment. A vehicle 1100 of the seventh embodiment is a railway vehicle. The vehicle 1100 includes a motor 140 and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, W. The AC voltage output from the inverter circuit 150 drives the motor 140. The wheels 90 of the vehicle 1100 are rotated by the motor 140.

According to the seventh embodiment, since the MOSFET 100 with improved characteristics is provided, the characteristics of the vehicle 1100 are improved.

Eighth Embodiment

The vehicle of the eighth embodiment is a vehicle including the semiconductor device of the first embodiment.

Figure 33:
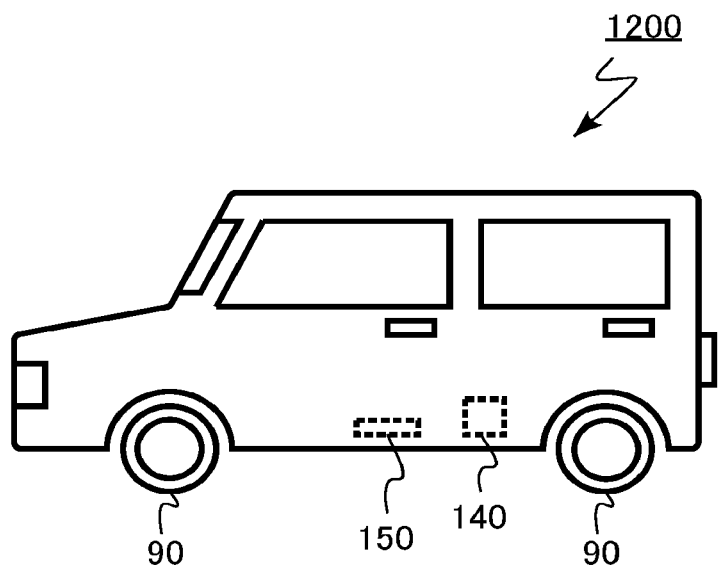
FIG. 33 is a schematic diagram of a vehicle of an eighth embodiment.

FIG. 33 is a schematic diagram of a vehicle according to the eighth embodiment. A vehicle 1200 of the eighth embodiment is a car. The vehicle 1200 includes a motor 140 and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, and W.

The AC voltage output from the inverter circuit 150 drives the motor 140. The wheels 90 of the vehicle 1200 are rotated by the motor 140.

According to the eighth embodiment, since the MOSFET 100 with improved characteristics is provided, the characteristics of the vehicle 1200 are improved.

Ninth Embodiment

The elevator of the ninth embodiment is an elevator including the semiconductor device of the first embodiment.

Figure 34:
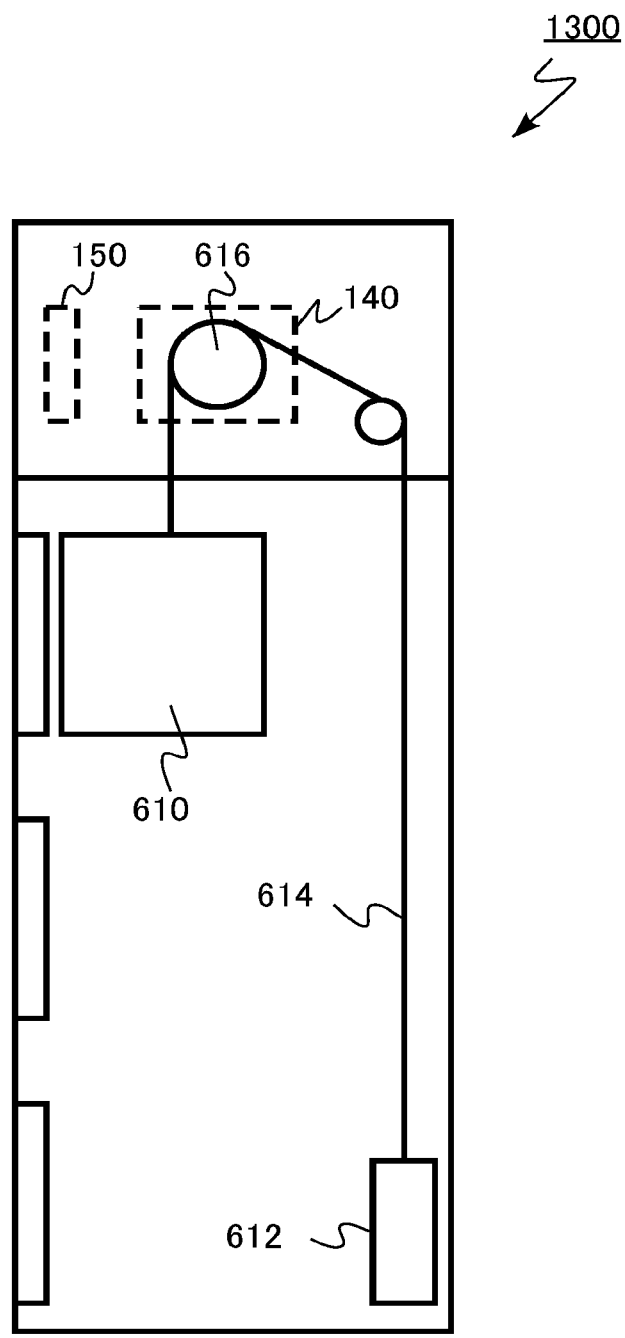
FIG. 34 is a schematic diagram of an elevator of a ninth embodiment.

FIG. 34 is a schematic diagram of the elevator of the ninth embodiment. An elevator 1300 of the ninth embodiment includes a car 610, a counterweight 612, a wire rope 614, a hoisting machine 616, a motor 140, and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, and W.

The AC voltage output from the inverter circuit 150 drives the motor 140. The hoisting machine 616 is rotated by the motor 140 to move the car 610 up and down.

According to the ninth embodiment, since the MOSFET 100 with improved characteristics is provided, the characteristics of the elevator 1300 are improved.

As described above, in the first to fifth embodiments, the case of 4H—SiC is described as an example of the crystal structure of silicon carbide. However, the present disclosure can also be applied to silicon carbide having other crystal structures such as 6H—SiC and 3C—SiC.

In the first to fifth embodiments, a MOSFET is described as an example of a semiconductor device, but the present disclosure can also be applied to an IGBT (Insulated Gate Bipolar Transistor). The IGBT can be realized by replacing the region corresponding to the drain region 30 of the MOSFET from n-type to p-type.

It is also possible to form a so-called superjunction structure in the drift region 32 of the first to fifth embodiments and further reduce the on-resistance.

In the sixth to ninth embodiments, the case of including the semiconductor device of the first embodiment has been described as an example, but the semiconductor devices of the second to fifth embodiments can also be applied.

In the sixth to ninth embodiments, the case of applying the semiconductor device of the present disclosure to a vehicle or an elevator has been described as an example, but the semiconductor device of the present disclosure can also be applied to, for example, a power conditioner of a solar power generation system.

While certain embodiments have been described, these embodiments have been presented by way of example only, and are not intended to limit the scope of the inventions. Indeed, semiconductor device, inverter circuit, driving device, vehicle, and elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane and a second plane facing the first plane, the first plane and the second plane being parallel to a first direction and a second direction perpendicular to the first direction;
   a first trench provided in the silicon carbide layer, the first trench extending in the first direction on the first plane, and the first trench having a first side plane, a second side plane, and a first bottom plane between the first side plane and the second side plane;
   a first gate electrode located in the first trench;
   a first gate insulating layer located between the first gate electrode and the silicon carbide layer;
   a second trench provided in the silicon carbide layer, the second trench extending in the first direction on the first plane, and the second trench having a third side plane facing the second side plane, a fourth side plane, and a second bottom plane between the third side plane and the fourth side plane;
   a second gate electrode located in the second trench;
   a second gate insulating layer located between the second gate electrode and the silicon carbide layer;
   a first silicon carbide region of n-type located in the silicon carbide layer;
   a second silicon carbide region of p-type located in the silicon carbide layer, the second silicon carbide region being located between the first silicon carbide region and the first plane, and the second silicon carbide region being located between the first trench and the second trench;
   a third silicon carbide region of n-type located in the silicon carbide layer and located between the second silicon carbide region and the first plane;
   a fourth silicon carbide region of n-type located in the silicon carbide layer and located between the second silicon carbide region and the first plane, the third silicon carbide region being interposed between the first trench and the fourth silicon carbide region;
   a fifth silicon carbide region of p-type located in the silicon carbide layer and located between the first silicon carbide region and the first trench, the fifth silicon carbide region covering the first bottom plane;
   a sixth silicon carbide region of p-type located in the silicon carbide layer and located between the first silicon carbide region and the second trench, the sixth silicon carbide region covering the second bottom plane, and the first silicon carbide region being interposed between the fifth silicon carbide region and the sixth silicon carbide region;
   a seventh silicon carbide region of n-type located in the silicon carbide layer and located between the fifth silicon carbide region and the second silicon carbide region;
   an eighth silicon carbide region of n-type located in the silicon carbide layer and located between the sixth silicon carbide region and the second silicon carbide region;
   a plurality of ninth silicon carbide regions of p-type located in the silicon carbide layer and located between the fifth silicon carbide region and the second silicon carbide region, the ninth silicon carbide regions being in contact with the fifth silicon carbide region and the second silicon carbide region, and the ninth silicon carbide regions being repeatedly disposed in the first direction; and
   a plurality of tenth silicon carbide regions of p-type located in the silicon carbide layer and located between the sixth silicon carbide region and the second silicon carbide region, the tenth silicon carbide regions being in contact with the sixth silicon carbide region and the second silicon carbide region, and the tenth silicon carbide regions being repeatedly disposed in the first direction, wherein
   a virtual line segment connecting the ninth silicon carbide region and the tenth silicon carbide region and being parallel to the first plane is oblique with respect to the second direction.

2. The semiconductor device according to claim 1, wherein the seventh silicon carbide region and the eighth silicon carbide region are in contact between the first trench and the second trench.

3. The semiconductor device according to claim 1, wherein an n-type impurity concentration of the seventh silicon carbide region and an n-type impurity concentration of the eighth silicon carbide region are higher than an n-type impurity concentration of the first silicon carbide region.

4. The semiconductor device according to claim 1, wherein the ninth silicon carbide regions and the tenth silicon carbide regions are alternately disposed in the first direction.

5. The semiconductor device according to claim 1, wherein a first pitch of disposition of the ninth silicon carbide regions is constant, a second pitch of disposition of the tenth silicon carbide regions is constant, and the first pitch and the second pitch are substantially equal.

6. The semiconductor device according to claim 1, wherein a p-type impurity concentration of the ninth silicon carbide region and a p-type impurity concentration of the tenth silicon carbide region are higher than a p-type impurity concentration of the second silicon carbide region.

7. The semiconductor device according to claim 1, wherein the ninth silicon carbide region is in contact with the second side plane and the tenth silicon carbide region is in contact with the third side plane.

8. The semiconductor device according to claim 1, wherein the seventh silicon carbide region is interposed between the ninth silicon carbide region and the second side plane and the eighth silicon carbide region is interposed between the tenth silicon carbide region and the third side plane.

9. The semiconductor device according to claim 1, further comprising:
   an eleventh silicon carbide region of p-type located in the silicon carbide layer and located between the first silicon carbide region and the first plane, the first trench being interposed between the second silicon carbide region and the eleventh silicon carbide region;
   a twelfth silicon carbide region of n-type located in the silicon carbide layer and located between the eleventh silicon carbide region and the first plane;
   a thirteenth silicon carbide region of n-type located in the silicon carbide layer and located between the fifth silicon carbide region and the eleventh silicon carbide region; and
   a plurality of fourteenth silicon carbide regions of p-type located in the silicon carbide layer and located between the fifth silicon carbide region and the eleventh silicon carbide region, the fourteenth silicon carbide regions being in contact with the fifth silicon carbide region and the eleventh silicon carbide region, and the fourteenth silicon carbide regions being repeatedly disposed in the first direction.

10. The semiconductor device according to claim 9, wherein a virtual line segment connecting the ninth silicon carbide region and the fourteenth silicon carbide region and being parallel to the first plane is oblique with respect to the second direction.

11. The semiconductor device according to claim 9, wherein a virtual line segment connecting the ninth silicon carbide region and the fourteenth silicon carbide region and being parallel to the first plane is parallel to the second direction.

12. The semiconductor device according to claim 9, further comprising:
   a fifteenth silicon carbide region of p-type located in the silicon carbide layer and located between the first silicon carbide region and the first plane, the second trench being interposed between the second silicon carbide region and the fifteenth silicon carbide region;
   a sixteenth silicon carbide region of n-type located in the silicon carbide layer and located between the fifteenth silicon carbide region and the first plane;
   a seventeenth silicon carbide region of n-type located in the silicon carbide layer and located between the sixth silicon carbide region and the fifteenth silicon carbide region; and
   a plurality of eighteenth silicon carbide regions of p-type located in the silicon carbide layer and located between the sixth silicon carbide region and the fifteenth silicon carbide region, the eighteenth silicon carbide regions being in contact with the sixth silicon carbide region and the fifteenth silicon carbide region, and the fifteenth silicon carbide region being repeatedly disposed in the first direction.

13. The semiconductor device according to claim 12, wherein a virtual line segment connecting the tenth silicon carbide region and the eighteenth silicon carbide region and being parallel to the first plane is oblique with respect to the second direction.

14. The semiconductor device according to claim 12, wherein a virtual line segment connecting the tenth silicon carbide region and the eighteenth silicon carbide region and being parallel to the first plane is parallel to the second direction.

15. An inverter circuit comprising a semiconductor device according to claim 1.

16. A driving device comprising a semiconductor device according to claim 1.

17. A vehicle comprising a semiconductor device according to claim 1.

18. An elevator comprising a semiconductor device according to claim 1.

19. A semiconductor device comprising:
   a silicon carbide layer having a first plane and a second plane facing the first plane, the first plane and the second plane being parallel to a first direction and a second direction perpendicular to the first direction;
   a first trench provided in the silicon carbide layer, the first trench extending in the first direction on the first plane, and the first trench having a first side plane, a second side plane, and a first bottom plane between the first side plane and the second side plane;
   a first gate electrode located in the first trench;
   a first gate insulating layer located between the first gate electrode and the silicon carbide layer;
   a second trench provided in the silicon carbide layer, the second trench extending in the first direction on the first plane, and the second trench having a third side plane facing the second side plane, a fourth side plane, and a second bottom plane between the third side plane and the fourth side plane;
   a second gate electrode located in the second trench;
   a second gate insulating layer located between the second gate electrode and the silicon carbide layer;
   a first silicon carbide region of n-type located in the silicon carbide layer;
   a second silicon carbide region of p-type located in the silicon carbide layer, the second silicon carbide region being located between the first silicon carbide region and the first plane, and the second silicon carbide region being located between the first trench and the second trench;
   a third silicon carbide region of n-type located in the silicon carbide layer and located between the second silicon carbide region and the first plane;
   a fourth silicon carbide region of n-type located in the silicon carbide layer and located between the second silicon carbide region and the first plane, the third silicon carbide region being interposed between the first trench and the fourth silicon carbide region;
   a fifth silicon carbide region of p-type located in the silicon carbide layer and located between the first silicon carbide region and the first trench, the fifth silicon carbide region covering the first bottom plane;
   a sixth silicon carbide region of p-type located in the silicon carbide layer and located between the first silicon carbide region and the second trench, the sixth silicon carbide region covering the second bottom plane, and the first silicon carbide region being interposed between the fifth silicon carbide region and the sixth silicon carbide region;
   a seventh silicon carbide region of n-type located in the silicon carbide layer and located between the fifth silicon carbide region and the second silicon carbide region;
   an eighth silicon carbide region of n-type located in the silicon carbide layer and located between the sixth silicon carbide region and the second silicon carbide region;
   a plurality of ninth silicon carbide regions of p-type located in the silicon carbide layer and located between the fifth silicon carbide region and the second silicon carbide region, the ninth silicon carbide regions being in contact with the fifth silicon carbide region and the second silicon carbide region, and the ninth silicon carbide regions being repeatedly disposed in the first direction; and a plurality of tenth silicon carbide regions of p-type located in the silicon carbide layer and located between the sixth silicon carbide region and the second silicon carbide region, the tenth silicon carbide regions being in contact with the sixth silicon carbide region and the second silicon carbide region, and tenth silicon carbide regions being repeatedly disposed in the first direction, wherein the seventh silicon carbide region is interposed between the ninth silicon carbide region and the second side plane and the eighth silicon carbide region is interposed between the tenth silicon carbide region and the third side plane.

20. The semiconductor device according to claim 19, wherein the seventh silicon carbide region and the eighth silicon carbide region are connected between the first trench and the second trench.

\* \* \* \* \*